US012813243B2

(12) United States Patent
Wu et al.

(10) Patent No.: US 12,813,243 B2
(45) Date of Patent: Nov. 24, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Yao-Cheng Wu, Changhua County (TW); Hua-Kai Lin, Taoyuan City (TW); Hao-Cheng Hou, Hsinchu (TW); Tsung-Ding Wang, Tainan (TW); Hao-Yi Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 351 days.

(21) Appl. No.: 18/442,677

(22) Filed: Feb. 15, 2024

(65) Prior Publication Data

US 2025/0125224 A1 Apr. 17, 2025

Related U.S. Application Data

(60) Provisional application No. 63/590,816, filed on Oct. 17, 2023.

(51) Int. Cl.
*H10W 20/20* (2026.01)
*H10W 70/60* (2026.01)
(Continued)

(52) U.S. Cl.
CPC .......... *H10W 20/20* (2026.01); *H10W 70/611* (2026.01); *H10W 70/635* (2026.01); *H10W 74/131* (2026.01); *H10W 90/401* (2026.01); *H10W 90/733* (2026.01); *H10W 90/734* (2026.01)

(58) Field of Classification Search
None
See application file for complete search history.

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

TW 201906116 A 2/2019
TW 201946232 A 12/2019
TW 202230541 A 8/2022

*Primary Examiner* — Nduka E Ojeh
(74) *Attorney, Agent, or Firm* — Slater Matsil, LLP

(57) ABSTRACT

In an embodiment, a device includes: an interposer including: a back-side redistribution structure; an interconnection die over the back-side redistribution structure, the interconnection die including a substrate, a through-substrate via protruding from the substrate, and an isolation layer around the through-substrate via; a first encapsulant around the interconnection die, a surface of the first encapsulant being substantially coplanar with a surface of the isolation layer and a surface of the through-substrate via; and a front-side redistribution structure over the first encapsulant, the front-side redistribution structure including a first conductive via that physically contacts the through-substrate via, the isolation layer separating the first conductive via from the substrate.

20 Claims, 26 Drawing Sheets

(51) Int. Cl.

| | |
|---|---|
| ***H10W 70/63*** | (2026.01) |
| ***H10W 74/10*** | (2026.01) |
| ***H10W 90/00*** | (2026.01) |

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 10,510,645 | B2 | 12/2019 | Wang et al. | |
| 10,727,198 | B2 | 7/2020 | Hsu et al. | |
| 11,817,426 | B2 | 11/2023 | Chen et al. | |
| 2013/0062761 | A1* | 3/2013 | Lin | H10P 72/74 257/737 |
| 2016/0027764 | A1* | 1/2016 | Kim | H10W 74/014 257/686 |
| 2019/0006315 | A1* | 1/2019 | Hsu | H10W 74/121 |
| 2020/0043893 | A1* | 2/2020 | Chen | H10P 72/74 |
| 2021/0098421 | A1* | 4/2021 | Wu | H10W 74/473 |
| 2021/0375826 | A1* | 12/2021 | Chen | H10P 54/00 |
| 2022/0223565 | A1* | 7/2022 | Chen | H10W 90/00 |

* cited by examiner

INTEGRATED CIRCUIT PACKAGES AND METHODS OF FORMING THE SAME

PRIORITY CLAIM AND CROSS-REFERENCE

This application claims the benefit of U.S. Provisional Application No. 63/590,816, filed on Oct. 17, 2023, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
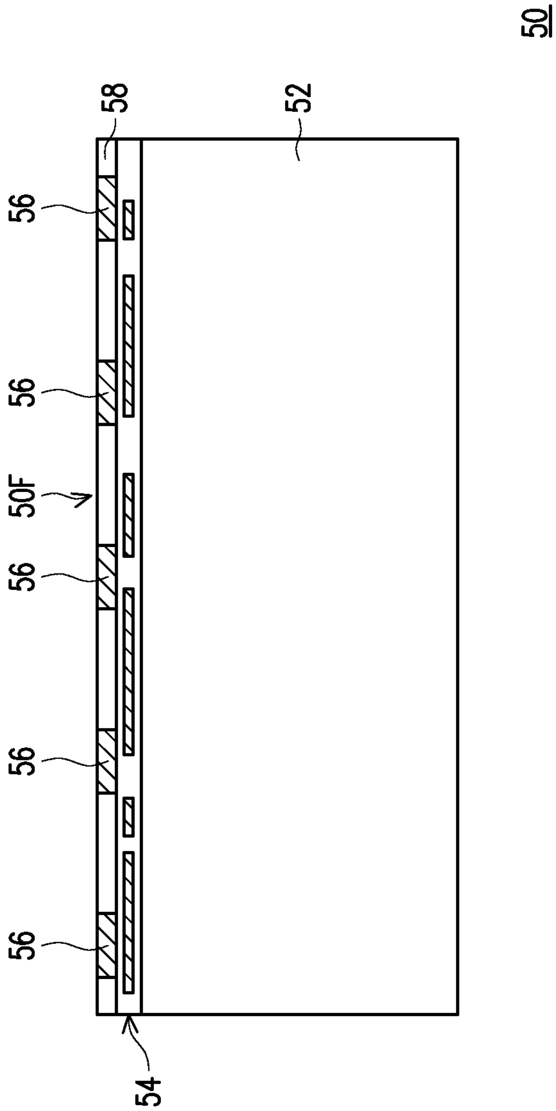
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, an interposer of an integrated circuit package includes an encapsulated interconnection die and a redistribution structure. The interconnection die includes through-substrate vias, which are small and have a high density. Conductive vias of the redistribution structure are physically and electrically coupled to the through-substrate vias. The conductive vias are oversized (e.g., larger than the through-substrate vias), which may help reduce the off-landing risk of the conductive vias (e.g., due to shifting during processing). The interconnection die also includes isolation layer(s) around the through-substrate vias at the back-side of the interconnection die. The isolation layer(s) separate the oversized conductive vias of the redistribution structure from a substrate of the interconnection die. The risk of electric leakage from the oversized conductive vias may thus be reduced, which may increase the performance of the integrated circuit package.

FIG. 1 is a cross-sectional view of an integrated circuit die 50. Multiple integrated circuit dies 50 will be packaged in subsequent processing to form integrated circuit packages. Each integrated circuit die 50 may be a logic die (e.g., central processing unit (CPU), graphics processing unit (GPU), system-on-a-chip (SoC) die, microcontroller, etc.), a memory die (e.g., dynamic random access memory (DRAM) die, static random access memory (SRAM) die, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), the like, or combinations thereof. The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward in FIG. 1) and an inactive surface (e.g., the surface facing downward in FIG. 1). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 together to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide, nitrides such as silicon nitride, combinations thereof such as silicon oxynitride, or the like. Other dielectric materials may also be used, such as a polymer, such as polybenzoxazole (PBO), polyimide, a benzocyclobuten (BCB) based polymer, or the like. The metallization layer(s) may include conductive vias and/or conductive lines to interconnect the devices of the semiconductor substrate 52. The metallization layer(s) may be formed of a conductive material, such as a metal, such as copper, cobalt, aluminum, gold, combinations thereof, or the like. The metallization layer(s) of the interconnect structure 54 may be formed by a damascene process, such as a single damascene process, a dual damascene process, or the like.

Die connectors 56 are at the front-side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

Optionally, solder regions (not separately illustrated) may be disposed on the die connectors 56 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed.

A dielectric layer 58 is at the front-side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof, which may be formed, for example, by spin coating, lamination, chemical vapor deposition (CVD), or the like. Top surfaces of the die connectors 56 and the dielectric layer 58 may be coplanar (within process variations) at the front-side 50F of the integrated circuit die 50.

Figure 2A:
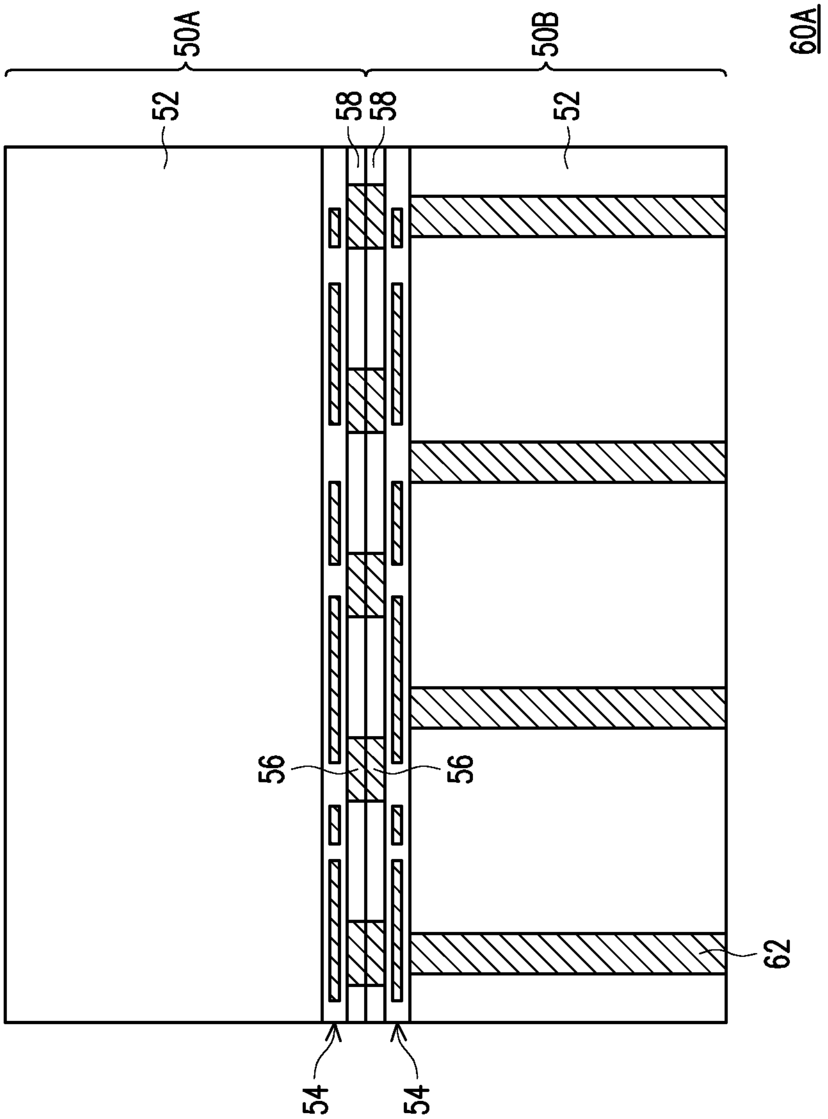
FIGS. 2A-2B are cross-sectional views of die stacks.
Figure 2B:
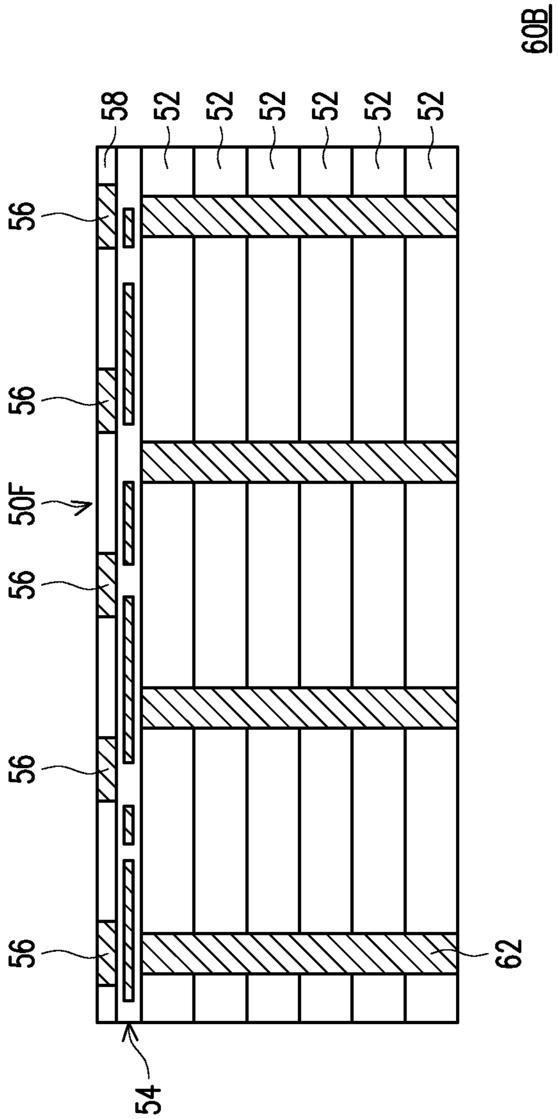

FIGS. 2A-2B are cross-sectional views of die stacks 60A, 60B, respectively. The die stacks 60A, 60B may each have a single function (e.g., a logic device, memory die, etc.), or may have multiple functions. In some embodiments, the die stack 60A is a logic device such as a system-on-integrated-chip (SoIC) device and the die stack 60B is a memory device such as high bandwidth memory (HBM) device.

As shown in FIG. 2A, the die stack 60A includes two bonded integrated circuit dies 50 (e.g., a first integrated circuit die 50A and a second integrated circuit die 50B). In some embodiments, the first integrated circuit die 50A is a logic die, and the second integrated circuit die 50B is an interface die. An interface die bridges a logic die to memory dies, and translates commands between the logic die and the memory dies. In some embodiments, the first integrated circuit die 50A and the second integrated circuit die 50B are bonded such that the active surfaces are facing each other (e.g., are "face-to-face" bonded). Conductive vias 62 may be formed through one of the integrated circuit dies 50 so that external connections may be made to the die stack 60A. The conductive vias 62 may be through-substrate vias (TSVs), such as through-silicon vias or the like. In the illustrated embodiment, the conductive vias 62 are formed in the second integrated circuit die 50B (e.g., the interface die). The conductive vias 62 extend through the semiconductor substrate 52 of the respective integrated circuit die 50, to be physically and electrically connected to the metallization layer(s) of the interconnect structure 54.

As shown in FIG. 2B, the die stack 60B is a stacked device that includes multiple semiconductor substrates 52. For example, the die stack 60B may be a memory device that includes multiple memory dies such as a hybrid memory cube (HMC) device, a high bandwidth memory (HBM) device, or the like. Each semiconductor substrate 52 may (or may not) have a separate interconnect structure 54. The semiconductor substrates 52 are connected by conductive vias 62, such as TSVs.

FIGS. 3-15 are views of intermediate stages in the manufacturing of integrated circuit packages 200 (see FIG. 15), in accordance with some embodiments. FIGS. 3, 4, 5, 6, 7, 8, 9, 10, 12, 13, 14, and 15 are cross-sectional views, while FIG. 11 is a top-down view. Multiple package regions 100P are illustrated, and an integrated circuit package 200 is formed in each package region 100P. An interposer wafer 100 is formed. The interposer wafer 100 includes an interposer 240 in each package region 100P. Integrated circuit devices 202 are bonded to the interposer wafer 100. The interposer 240 in each package region 100P may include an interconnection die 120 for interconnecting the integrated circuit devices 202 in the respective package region 100P. Package substrates 220 are then mounted to the interposer wafer 100. Specifically, a package substrate 220 is attached to the interposer 240 in each package region 100P. The package regions 100P are then singulated to form the integrated circuit packages 200, which each include a package substrate 220 and a singulated portion of the interposer wafer 100 (e.g., an interposer 240). In an embodiment, the integrated circuit packages 200 are chip-on-wafer-on-substrate (CoWoS®) packages, such as CoWoS-L packages, although it should be appreciated that embodiments may be applied to other 3DIC packages.

Figure 3:
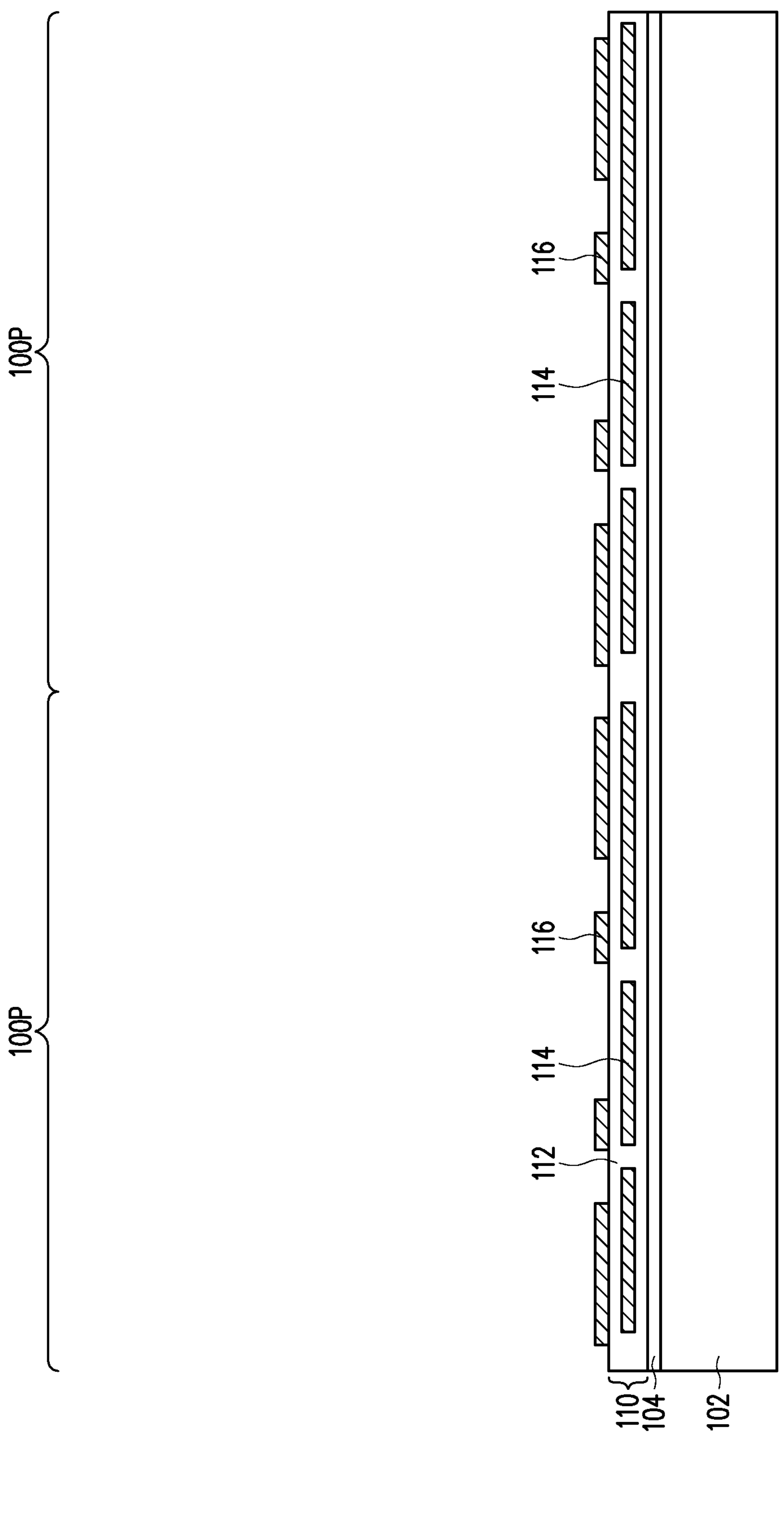
FIGS. 3-15 are views of intermediate stages in the manufacturing of integrated circuit packages, in accordance with some embodiments.

In FIG. 3, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

A back-side redistribution structure 110 is formed on the release layer 104. The back-side redistribution structure 110 includes dielectric layers 112 and metallization layers 114 (sometimes referred to as redistribution layers or redistribution lines) among the dielectric layers 112. Thus, the back-side redistribution structure 110 includes metallization layers 114 separated from each other by respective dielectric layers 112.

In some embodiments, the dielectric layers 112 are formed of a polymer, which may be a photosensitive material such as PBO, polyimide, a BCB-based polymer, or the like, that may be patterned using a lithography mask. In other embodiments, the dielectric layers 112 are formed of a nitride such as silicon nitride, an oxide such as silicon oxide, or the like. The dielectric layers 112 may be formed by spin coating, lamination, CVD, the like, or a combination thereof. After a dielectric layer 112 is formed, it may be patterned to expose underlying conductive features (if present), such as portions of underlying metallization layers 114. The patterning may be by any acceptable process, such as by exposing the dielectrics layers to light when the dielectric layers 112 are a photosensitive material, or by etching using, for example, an anisotropic etch. If the dielectric layers 112 are photosensitive materials, the dielectric layers 112 can be developed after the exposure.

The metallization layers 114 each include conductive vias and/or conductive lines. The conductive vias extend through respective dielectric layers 112, and the conductive lines extend along respective dielectric layers 112. As an example to form a metallization layer 114, a seed layer (not separately illustrated) is formed over the respective underlying features. For example, the seed layer can be formed on a respective dielectric layer 112 and in any openings through the respective dielectric layer 112. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using a deposition process, such as physical vapor deposition (PVD) or the like. A photoresist is then formed and patterned on the seed layer. The photoresist may be formed by spin coating or the like and may be exposed to light for patterning. The pattern of the photoresist corresponds to the metallization layer 114. The patterning forms openings through the photoresist to expose the seed layer. A conductive material is formed in the openings of the photoresist and on the exposed portions of the seed layer. The conductive material may be formed by plating, such as electroless plating or electroplating from the seed layer, or the like. The conductive material may include a metal or a metal alloy, such as copper, titanium, tungsten, aluminum, the like, or combinations thereof. Then, the photoresist and portions of the seed layer on which the conductive material are not formed are removed. The photoresist may be removed by an acceptable ashing or stripping process, such as using an oxygen plasma or the like. Once the photoresist is removed, exposed portions of the seed layer are removed, such as by an acceptable etching process, such as by wet or dry etching. The remaining portions of the seed layer and conductive material form a metallization layer 114 of the back-side redistribution structure 110.

The back-side redistribution structure 110 is illustrated as an example. More or fewer dielectric layers 112 and metallization layers 114 than illustrated may be formed by performing the previously described steps any desired quantity of times.

Under-bump metallization layers (UBMLs) 116 are formed for subsequent connection to the back-side redistribution structure 110. The UBMLs 116 have bump portions on and extending along the major surface of the upper dielectric layer 112 of the back-side redistribution structure 110, and have via portions extending through the upper dielectric layer 112 of the back-side redistribution structure 110 to physically and electrically couple the upper metallization layer 114 of the back-side redistribution structure 110. The UBMLs 116 may be formed of the same material as the metallization layers 114, and may be formed by a similar process as the metallization layers 114. In some embodiments, the UBMLs 116 have a different size than the metallization layers 114.

Figure 4:
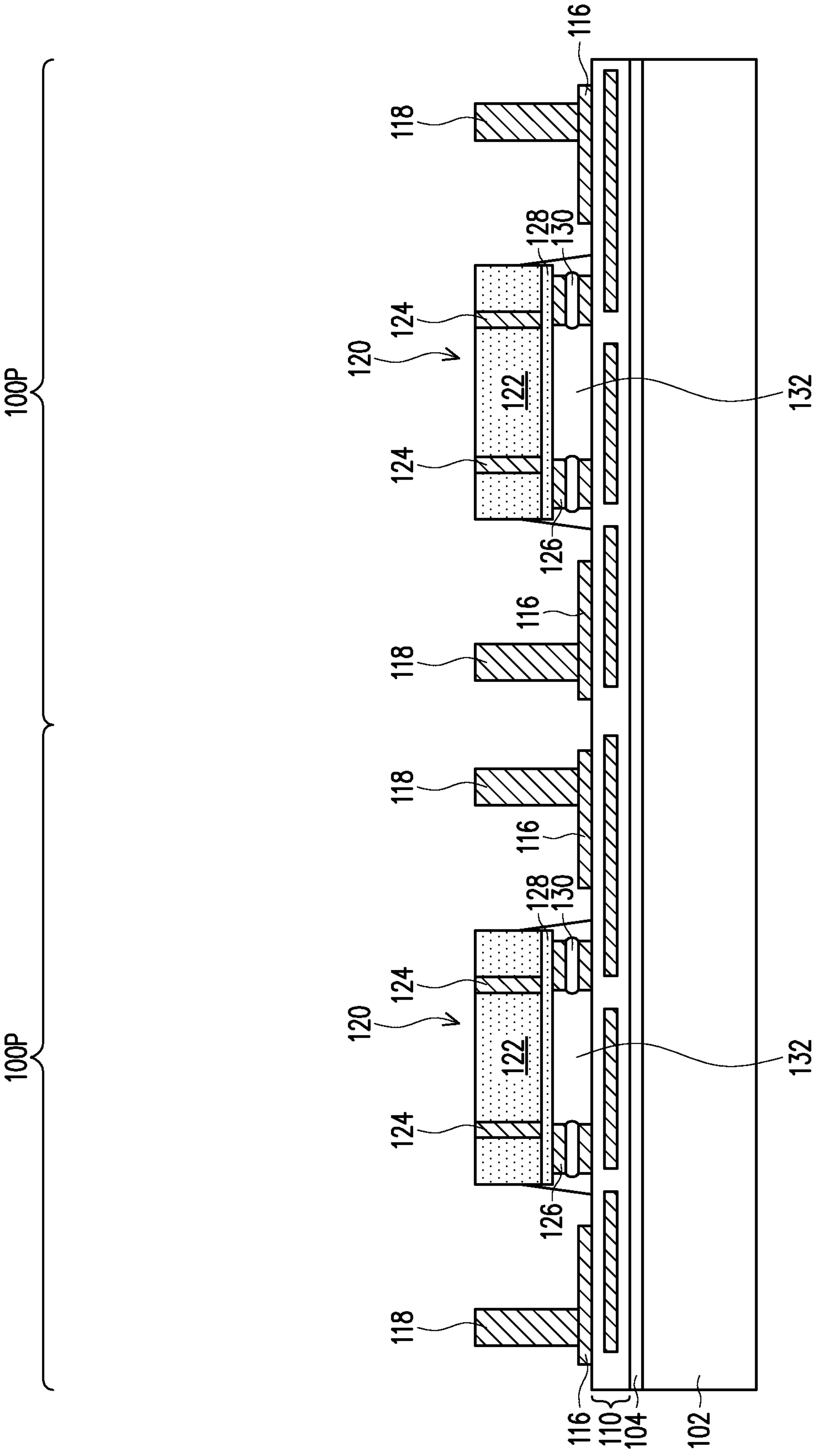

In FIG. 4, through vias 118 are formed on a first subset of the UBMLs 116. Additionally, interconnection dies 120 are attached to a second subset of the UBMLs 116. The second subset of the UBMLs 116 remain free of the through vias 118. The first subset of the UBMLs 116 and the through vias 118 will be subsequently utilized for connection to higher layers of the integrated circuit packages 200. The second subset of the UBMLs 116 and the interconnection dies 120 will be subsequently utilized for direct communication between integrated circuit dies of the integrated circuit packages 200.

As an example to form the through vias 118, a photoresist is formed and patterned on the UBMLs 116 and the back-side redistribution structure 110. The photoresist may be formed by spin coating or the like and may be exposed to light for patterning. The pattern of the photoresist corresponds to the through vias 118. The patterning forms openings through the photoresist to expose the UBMLs 116. A conductive material is formed in the openings of the photoresist and on the exposed portions of the UBMLs 116. The conductive material may be formed by plating, such as electroplating or electroless plating, or the like. The conductive material of the through vias 118 may be directly plated from a conductive material of the UBMLs 116. The conductive material may include a metal, like copper, titanium, tungsten, aluminum, or the like. The photoresist is then removed. The photoresist may be removed by an acceptable ashing or stripping process, such as using an oxygen plasma or the like. The remaining portions of the conductive material form the through vias 118.

Each interconnection die 120 may be a local silicon interconnect (LSI), a large scale integration package, an interposer die, or the like. In the illustrated embodiment, one interconnection die 120 is attached in each package region 100P. It should be appreciated that any desired quantity of interconnection dies 120 may be attached in each package region 100P.

Each interconnection die 120 includes a substrate 122, with conductive features formed in and/or on the substrate 122. The substrates 122 may include a semiconductor substrate, one or more dielectric layer(s), or the like. Additionally, each interconnection die 120 may include through-substrate vias (TSVs) 124 that extend into or through the substrate 122, and may be coupled to the conductive features of the interconnection die 120. In the illustrated embodiment, the TSVs 124 are exposed at the back-sides of the interconnection dies 120. In another embodiment, the substrates 122 may initially cover the TSVs 124 at the back-sides of the interconnection dies 120. The interconnection die 120 is attached to the UBMLs 116 using die connectors 126 disposed at the front-side of the interconnection die 120. Some of the die connectors 126 may be electrically coupled to the back-side of the interconnection die 120 by the TSVs 124. As subsequently described in greater detail, the TSVs 124 are small, such as smaller than the through vias 118. As a result of the TSVs 124 being small, they may have a greater density, thereby increasing the amount of connections to the interconnection dies 120.

In embodiments where the interconnection dies 120 are LSIs, the interconnection dies 120 may be bridge structures that include die bridges 128. The die bridges 128 may be metallization layers formed in and/or on, e.g., the substrate 122, and work to interconnect integrated circuit devices (subsequently described) to one another. The die bridges 128 are located at the front-side of the interconnection dies 120. As such, the LSI can be used to directly connect and allow communication between the integrated circuit devices. In such embodiments, the interconnection dies 120 can be placed in a region that is disposed between the subsequently attached integrated circuit devices, so that each interconnection die 120 overlaps the overlying integrated circuit devices. In some embodiments, the interconnection dies 120 may further include logic devices and/or memory devices. In some embodiments, the interconnection dies 120 may be free of logic devices and/or memory devices. The interconnection dies 120 are attached to the UBMLs 116 such that the die bridges 128 face the back-side redistribution structure 110.

In the illustrated embodiment, the interconnection dies 120 are attached to the back-side redistribution structure 110 (via the UBMLs 116) with solder bonds, such as with conductive connectors 130. The conductive connectors 130 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 130 may include a conductive material such as solder, copper, aluminum, gold, nickel, silver, palladium, tin, the like, or a combination thereof. In some embodiments, the conductive connectors 130 are formed by initially forming a layer of solder through evaporation, electroplating, printing, solder transfer, ball placement, or the like. Once a layer of solder has been formed on the structure, a reflow may be performed in order to shape the material into the desired bump shapes. Attaching the interconnection die 120 to the UBMLs 116 may include placing the interconnection die 120 on the UBMLs 116 (e.g., using a pick-and-place process) and reflowing the conductive connectors 130 to physically and electrically couple the die connectors 126 to the UBMLs 116. In another embodiment, the interconnection dies 120 are attached to the back-side redistribution structure 110 with direct bonds, using the die connectors 126.

In some embodiments, an underfill 132 is formed around the conductive connectors 130, and between the back-side redistribution structure 110 and the interconnection dies 120. The underfill 132 may reduce stress and protect the joints resulting from the reflowing of the conductive connectors 130. The underfill 132 may also be used to securely bond the interconnection dies 120 to the back-side redistribution structure 110 and provide structural support and environmental protection. The underfill 132 may be formed of a molding compound, epoxy, or the like. The underfill 132 may be formed by a capillary flow process after the interconnection dies 120 are attached, or may be formed by a suitable deposition method before the interconnection dies 120 are attached. The underfill 132 may be applied in liquid or semi-liquid form and then subsequently cured.

Figure 5:
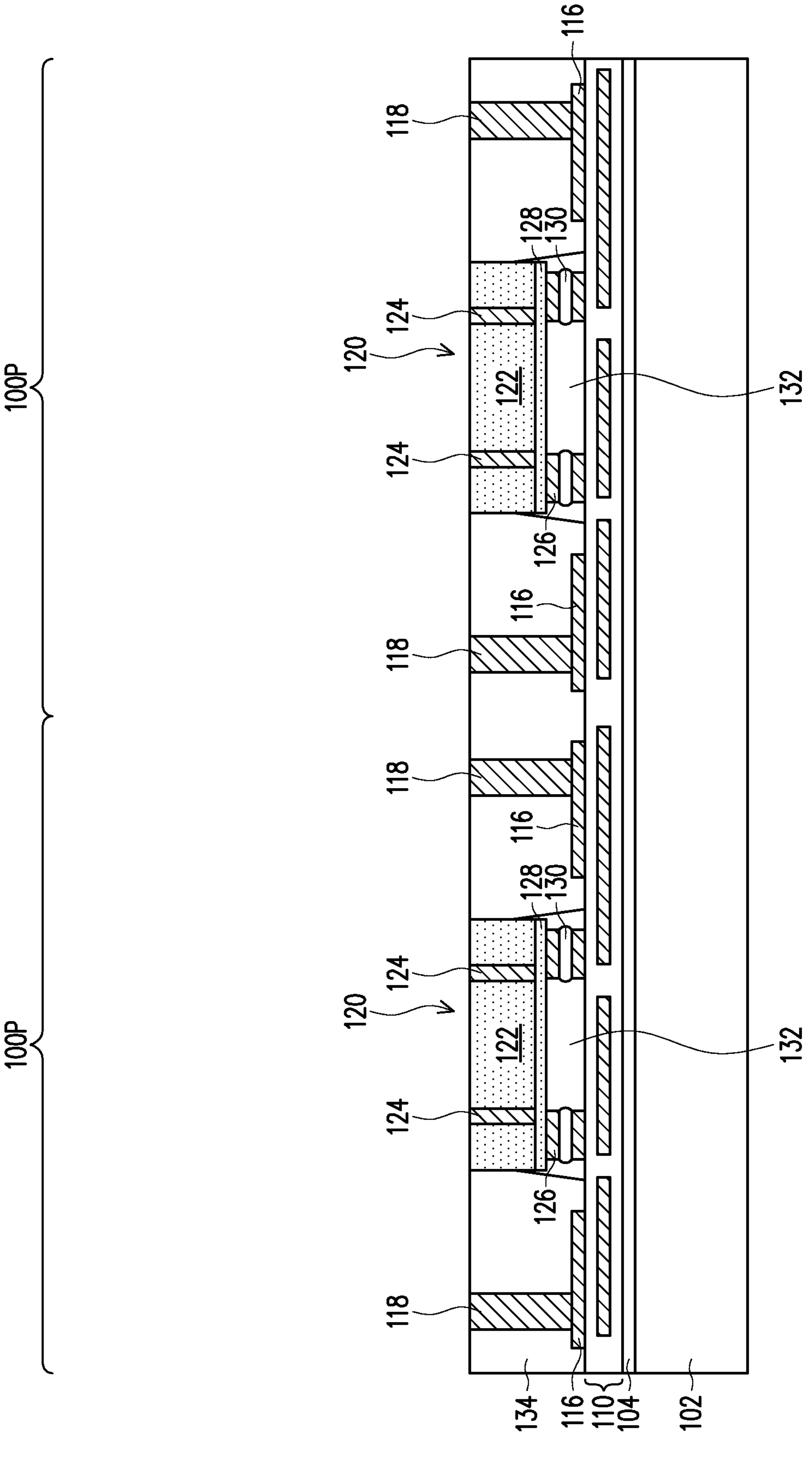

In FIG. 5, an encapsulant 134 is formed on and around the various components. After formation, the encapsulant 134 encapsulates the UBMLs 116, the underfill 132, the through vias 118, and/or the interconnection dies 120. The encapsulant 134 may be a molding compound, epoxy, or the like. The encapsulant 134 may be applied by compression molding, transfer molding, or the like, and may be formed over the carrier substrate 102 such that the through vias 118 and/or the interconnection dies 120 are buried or covered. The encapsulant 134 is further formed in gap regions between the interconnection dies 120 and the through vias 118. The encapsulant 134 may be applied in liquid or semi-liquid form and then subsequently cured.

A planarization process may optionally be performed on the encapsulant 134 to expose the through vias 118, the substrates 122, and the TSVs 124. The planarization process may remove material of the through vias 118, the substrates 122, and/or the TSVs 124 until the TSVs 124 and the through vias 118 are exposed. The top surfaces of the through vias 118, the substrates 122, the TSVs 124, and the encapsulant 134 are substantially coplanar (within process variations) after the planarization process. The planarization process may be, for example, a chemical-mechanical polish (CMP), a grinding process, or the like. In some embodiments, the planarization may be omitted, for example, if the through vias 118 and/or the TSVs 124 are already exposed. After the planarization process, the through vias 118 extend through the encapsulant 134. As such, the through vias 118 may be referred to as through-mold vias (TMVs).

Figure 6:
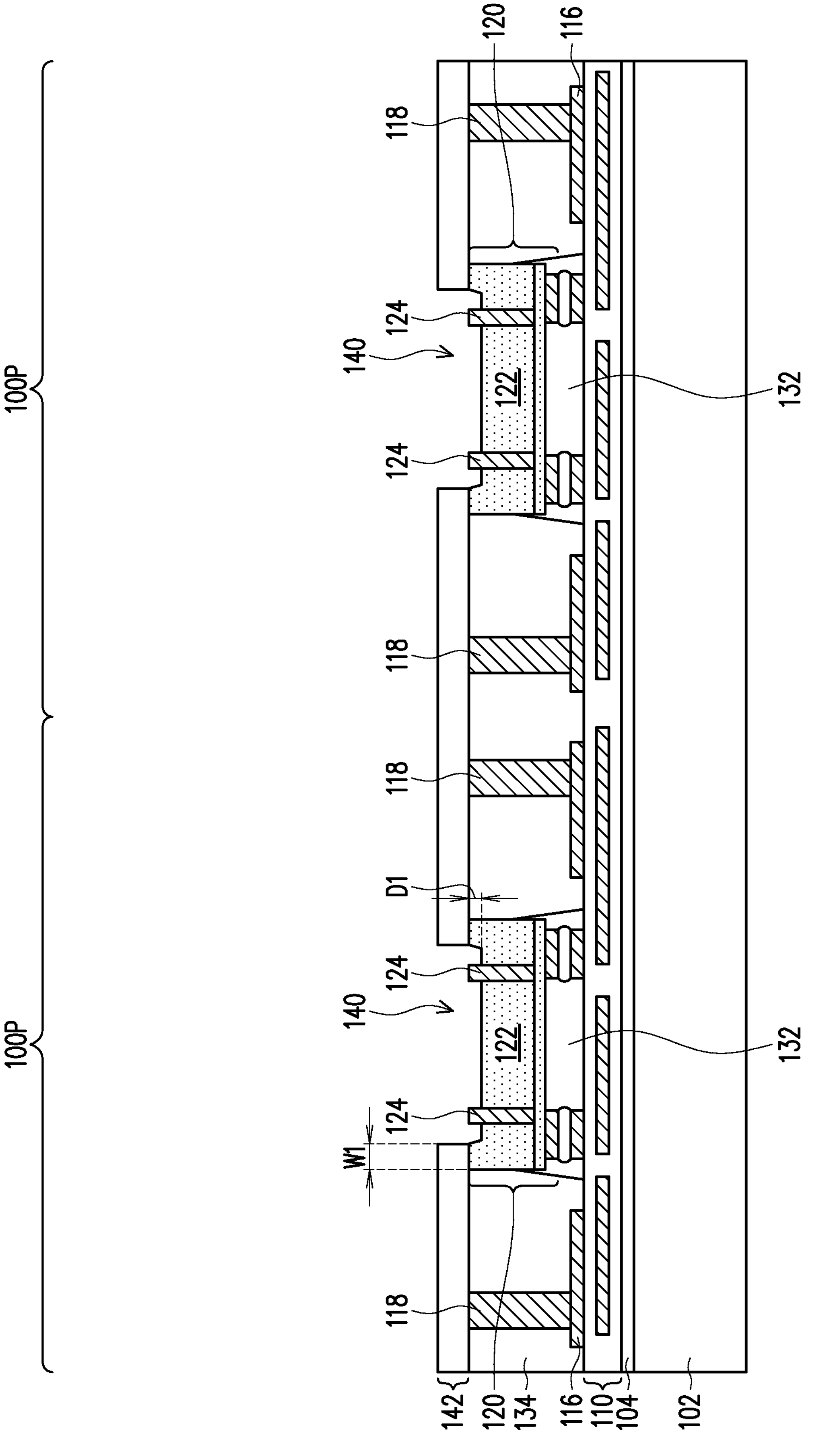

In FIG. 6, recesses 140 are patterned in the substrates 122 of the interconnection dies 120. The bottom surfaces of the recesses 140 are lower than the back-side surfaces of the substrates 122, such that there are respective steps therebetween. Further, the bottom surfaces of the recesses 140 are lower than surfaces of the TSVs 124. Thus, after the recesses 140 are formed, the TSVs 124 protrude from the back-sides of the substrates 122. The sidewalls of the TSVs 124 may be exposed by the recesses 140. The recesses 140 may be formed to a depth D1 in the range of 2 μm to 6 μm, such as about 2 μm. The sidewalls of the recesses 140 may be inclined sidewalls (as shown), straight sidewalls (that are perpendicular to the back-side surfaces of the substrates 122), or the like.

In the illustrated embodiment, a single recess 140 is formed in each substrate 122, such that a recess 140 encircles all of the TSVs 124 protruding from a substrate 122. The unrecessed portions of the substrates 122 extend around the TSVs 124. The unrecessed portions of the substrates 122 may have a width W1 that is non-zero, such as in the range of 5 μm to 40 μm. The recess 140 in each substrate 122 may have any desired shape in a top-down view (not separately illustrated). For example, the recesses 140 may be square recesses, rectangular recesses, circular recesses, or the like. In another embodiment, multiple recesses 140 are formed in each substrate 122, such that each recess 140 encircles a corresponding TSV 124 protruding from a substrate 122.

As an example to pattern the recesses 140, a mask 142 may be formed over the encapsulant 134 and at least a periphery of the substrates 122. Specifically, the unrecessed portions of the substrate 122 are covered by the mask 142. The mask 142 will be used as an etching mask during an etching processes for patterning the recesses 140. The encapsulant 134 may be completely covered by the features of the mask 142, which may help avoid contamination of the encapsulant 134, such as during the etching process for patterning the recesses 140. In some embodiments, the mask 142 is formed of a photoresist, such as a single layer photoresist, a tri-layer photoresist, or the like. For example, the mask 142 may be a tri-layer photoresist including a bottom layer (e.g., a bottom anti-reflective coating (BARC) layer), a middle layer (e.g., a hardmask), and a top layer (e.g., a photoresist). The photoresist may be formed by spin coating, a deposition process such as CVD, combinations thereof, or the like, and can be patterned using any acceptable photolithography techniques to have a desired pattern of the recesses 140. The recesses 140 may then be formed by etching the substrates 122 using the mask 142 as an etching mask. The etching may be any acceptable etch process, such as a dry etch, such as a reactive ion etch (RIE), neutral beam etch (NBE), the like, or a combination thereof. The etching may be anisotropic. After the etching process, the mask 142 may be removed, such as by any acceptable ashing process, etching process, or the like.

Figure 7:
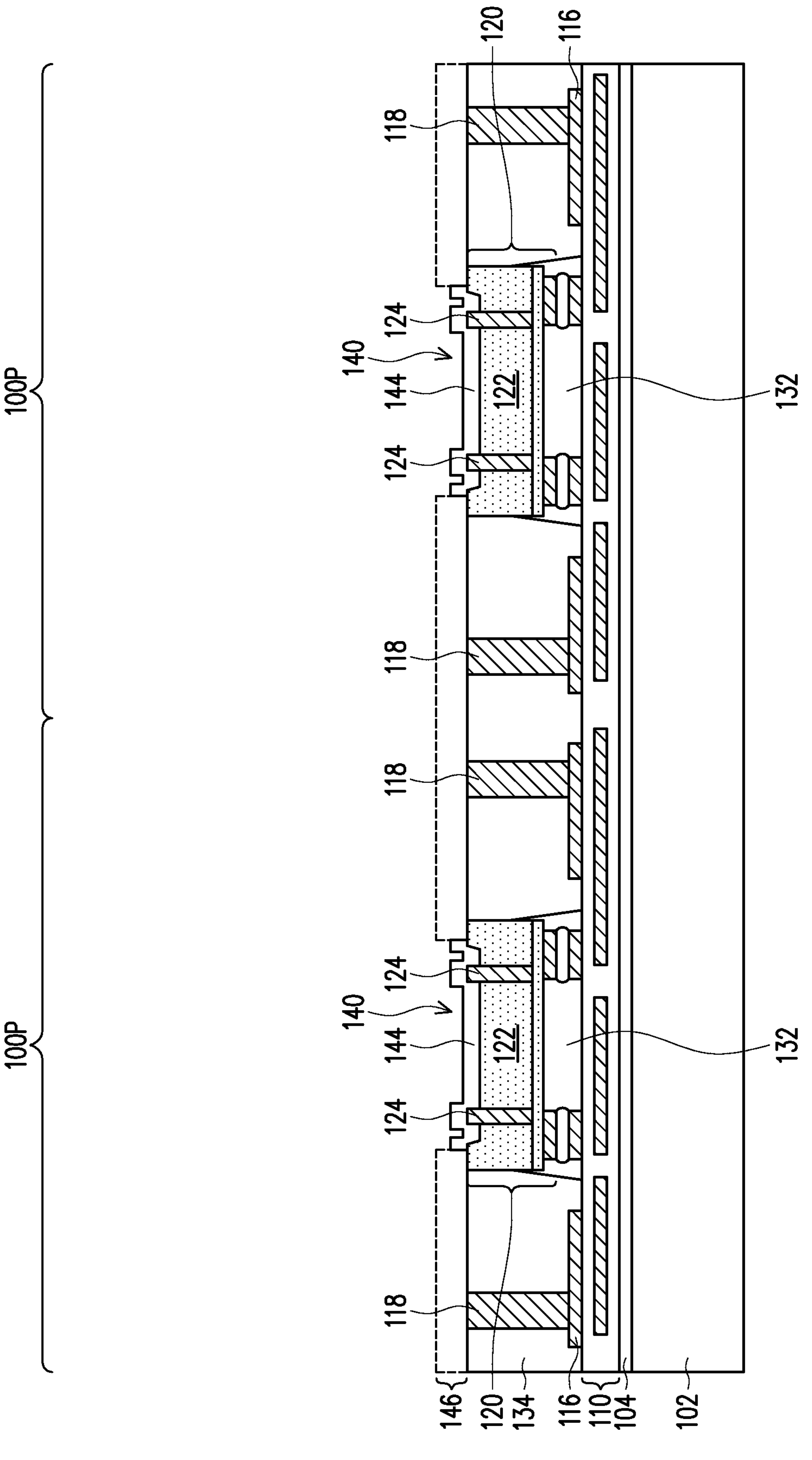

In FIG. 7, isolation layers 144 are formed in the recesses 140. The isolation layers 144 completely fill the recesses 140, and surround the protruding portions of the TSVs 124. The isolation layers 144 are formed of any material that can reduce electric leakage. In some embodiments, the isolation layers 144 are formed of a silicon-containing insulator, such as silicon nitride, silicon oxynitride, or the like, which may be formed by a suitable deposition method such as CVD, plasma-enhanced CVD (PECVD), high density plasma CVD (HDP-CVD), or the like. In some embodiments, the isolation layers 144 are formed of a high-k dielectric material, such as a metal oxide or the like. In some embodiments, the isolation layers 144 are formed of a resin-based material such as an epoxy or the like. Each isolation layer 144 may include a single material layer or multiple sublayers of different materials. Initially, the isolation layers 144 may bury the TSVs 124. The isolation layers 144 are embedded in the interconnection dies 120, and will be referred to as being part of the interconnection dies 120. The portions of the isolation layers 144 in the recesses 140 may have inclined sidewalls (as shown), straight sidewalls (that are perpendicular to the back-side surfaces of the substrates 122), or the like. The thickness of the isolation layers 144 may be greater than the depth of the recesses 140.

In the illustrated embodiment, each interconnection dies 120 includes a single isolation layer 144 that encircles all of the TSVs 124 protrude from a substrate 122. In another embodiment, each interconnection dies 120 includes multiple isolation layers 144, such that each isolation layer 144 encircles one TSV 124 protruding from a substrate 122.

In the illustrated embodiment, a respective isolation layer 144 is formed over a respective substrate 122. For example, a mask 146 may optionally be formed over the encapsulant 134. In some embodiments, the mask 146 is formed of a photoresist, such as a single layer photoresist, a tri-layer photoresist, or the like. For example, the mask 146 may be a tri-layer photoresist including a bottom layer (e.g., a bottom anti-reflective coating (BARC) layer), a middle layer (e.g., a hardmask), and a top layer (e.g., a photoresist). The photoresist may be formed by spin coating, a deposition process such as CVD, combinations thereof, or the like, and can be patterned using any acceptable photolithography techniques to have a desired pattern of the isolation layers 144. The isolation layers 144 may then be deposited in openings in the mask 146. After the isolation layers 144 are deposited, the mask 146 may be removed, such as by any acceptable ashing process, etching process, or the like. In another embodiment, the mask 146 is omitted and instead a single isolation layer 144 is formed over each substrate 122.

Figure 8:
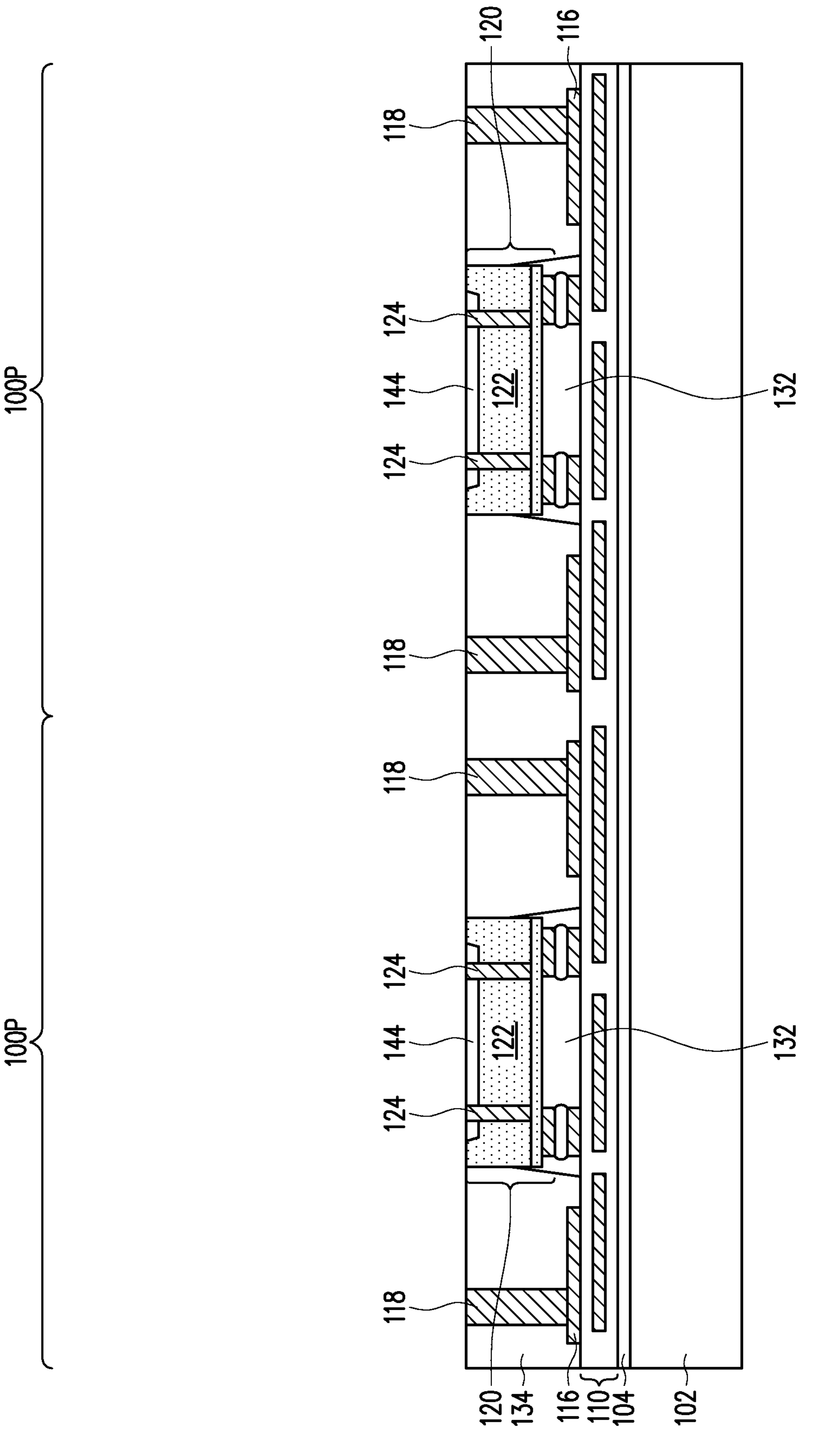

In FIG. 8, a removal process is applied to the isolation layers 144 to remove excess materials over the TSVs 124, thereby revealing the TSVs 124. The removal process may be a planarization process such as a chemical mechanical polish (CMP), an etch-back, combinations thereof, or the like. The planarization process may remove materials of the through vias 118, the substrates 122, the TSVs 124, the encapsulant 134, and/or the isolation layers 144. The top surfaces of the through vias 118, the substrates 122, the TSVs 124, the encapsulant 134, and the isolation layers 144 are substantially coplanar (within process variations) after the planarization process. The top surfaces of the isolation layers 144 may have planarization marks after the planarization process. After the TSVs 124 are revealed, they extend from the font-sides of the interconnection dies 120 to the back-sides of the interconnection dies 120.

Figure 9:
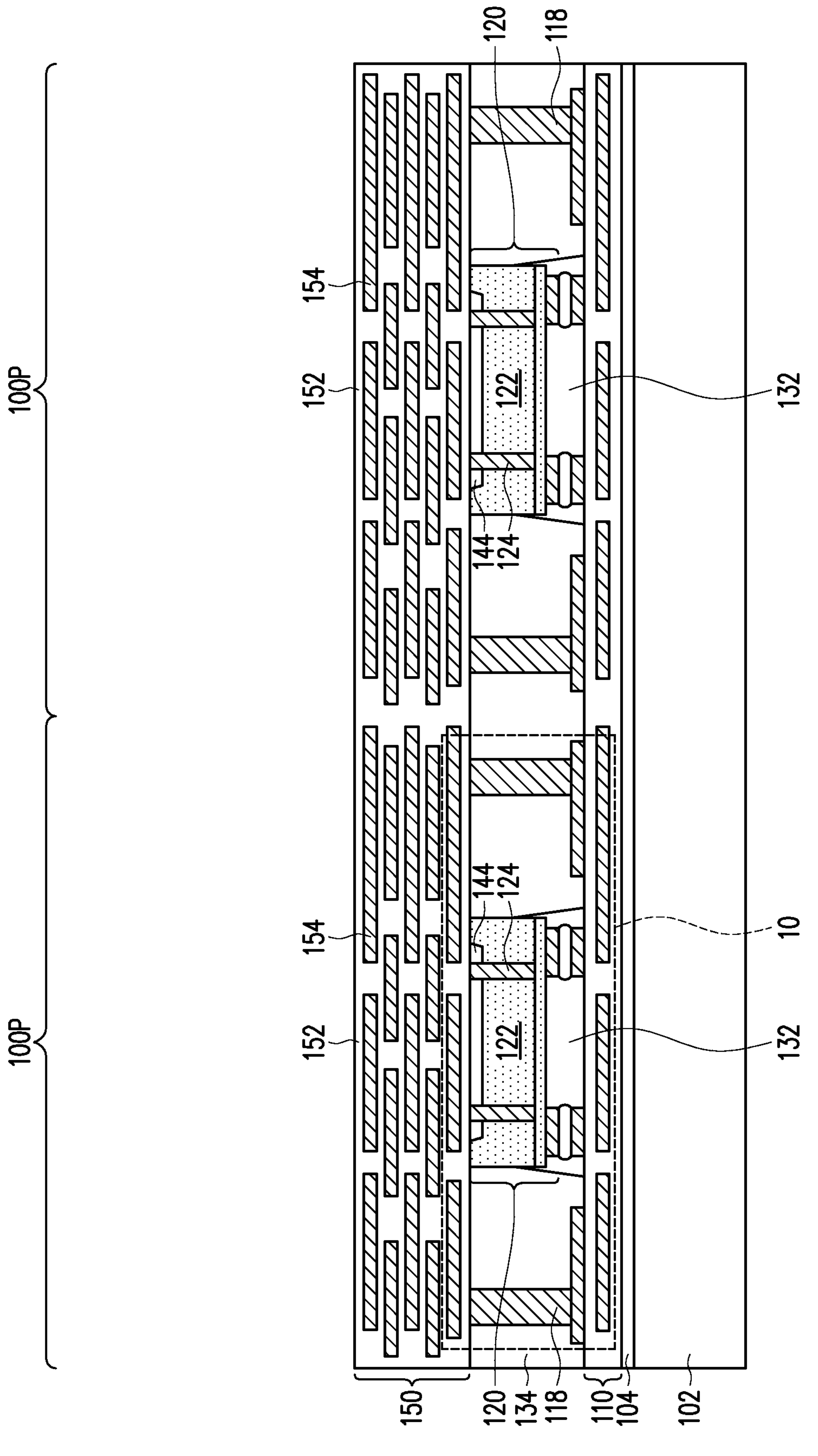

In FIG. 9, a front-side redistribution structure 150 is formed on the top surfaces of the through vias 118, the interconnection dies 120 (e.g., the substrates 122, the TSVs 124, and the isolation layers 144), and the encapsulant 134. The front-side redistribution structure 150 includes dielectric layers 152 and metallization layers 154 (sometimes referred to as redistribution layers or redistribution lines) among the dielectric layers 152. Thus, the front-side redistribution structure 150 includes metallization layers 154 separated from each other by respective dielectric layers 152. The metallization layers 154 of the front-side redistribution structure 150 are connected to the through vias 118 and to the interconnection dies 120 (e.g., the TSVs 124).

In some embodiments, the dielectric layers 152 are formed of a polymer, which may be a photosensitive material such as PBO, polyimide, a BCB-based polymer, or the like, that may be patterned using a lithography mask. In other embodiments, the dielectric layers 152 are formed of a nitride such as silicon nitride, an oxide such as silicon oxide, or the like. The dielectric layers 152 may be formed by spin coating, lamination, CVD, the like, or a combination thereof. After a dielectric layer 152 is formed, it may be patterned to expose underlying conductive features, such as portions of the underlying through vias 118, the TSVs 124, and/or the metallization layers 154. The patterning may be by any acceptable process, such as by exposing the dielectrics layers to light when the dielectric layers 152 are a photosensitive material, or by etching using, for example, an anisotropic etch. If the dielectric layers 152 are photosensitive materials, the dielectric layers 152 can be developed after the exposure.

The metallization layers 154 each include conductive vias and/or conductive lines. The conductive vias extend through respective dielectric layers 152, and the conductive lines extend along respective dielectric layers 152. As an example to form a metallization layer 154, a seed layer (not separately illustrated) is formed over the respective underlying features. For example, the seed layer can be formed on a respective dielectric layer 152 and in any openings through the respective dielectric layer 152. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization layer 154. The patterning forms openings through the photoresist to expose the seed layer. A conductive material is formed in the openings of the photoresist and on the exposed portions of the seed layer. The conductive material may be formed by plating, such as electroless plating or electroplating from the seed layer, or the like. The conductive material may include a metal or a metal alloy, such as copper, titanium, tungsten, aluminum, the like, or combinations thereof. Then, the photoresist and portions of the seed layer on which the conductive material are not formed are removed. The photoresist may be removed by an acceptable ashing or stripping process, such as using an oxygen plasma or the like. Once the photoresist is removed, exposed portions of the seed layer are removed, such as by an acceptable etching process, such as by wet or dry etching. The remaining portions of the seed layer and conductive material form a metallization layer 154 of the front-side redistribution structure 150.

The front-side redistribution structure 150 is illustrated as an example. More or fewer dielectric layers 152 and metallization layers 154 than illustrated may be formed by performing the previously described steps any desired quantity of times.

Other variations of the front-side redistribution structure 150 are contemplated. For example, some of the dielectric layers 152 may be formed of an encapsulant, such as a molding compound, epoxy, or the like. A metallization layer 154 may be formed by plating a conductive via from a conductive line. A dielectric layer 152 may be formed by encapsulating that metallization layer 154. Any desired stack of materials may be used for the dielectric layers 152.

In some embodiments, the dielectric layers 152 are formed of the same material as the isolation layers 144. As a result, there may be no discernable interfaces between the isolation layers 144 and the bottom dielectric layer 152. In some embodiments, the dielectric layers 152 are formed of a different material than the isolation layers 144. As a result, there may be discernable interfaces between the isolation layers 144 and the bottom dielectric layer 152.

Figure 10:
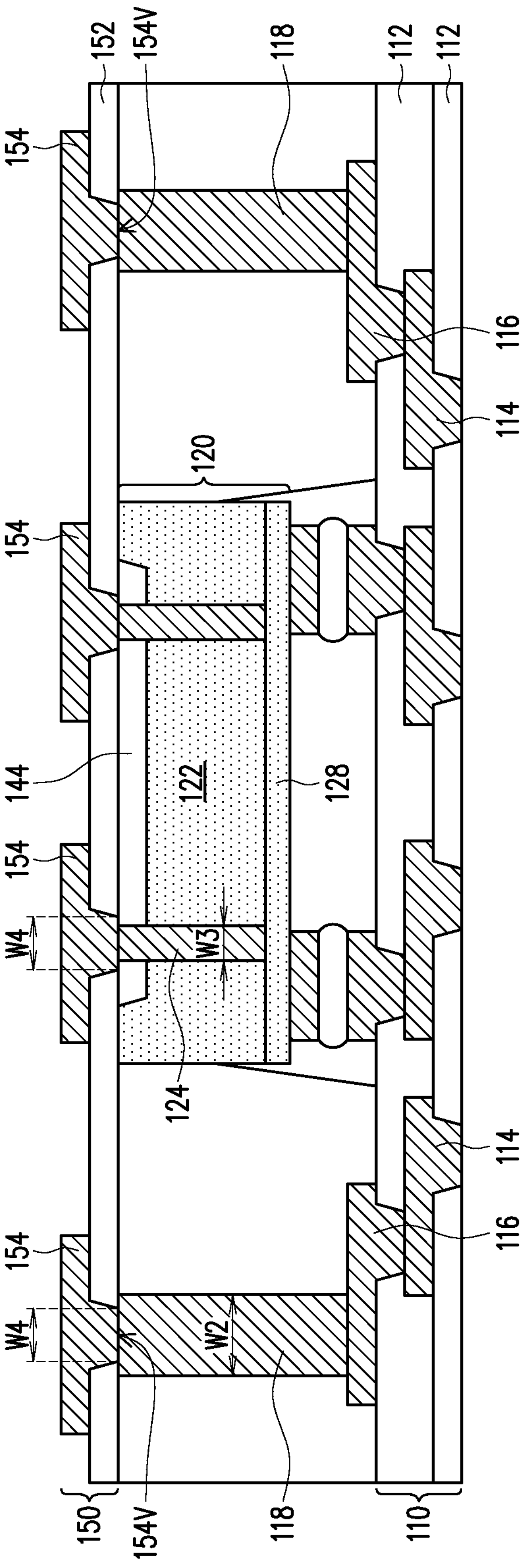
Figure 11:
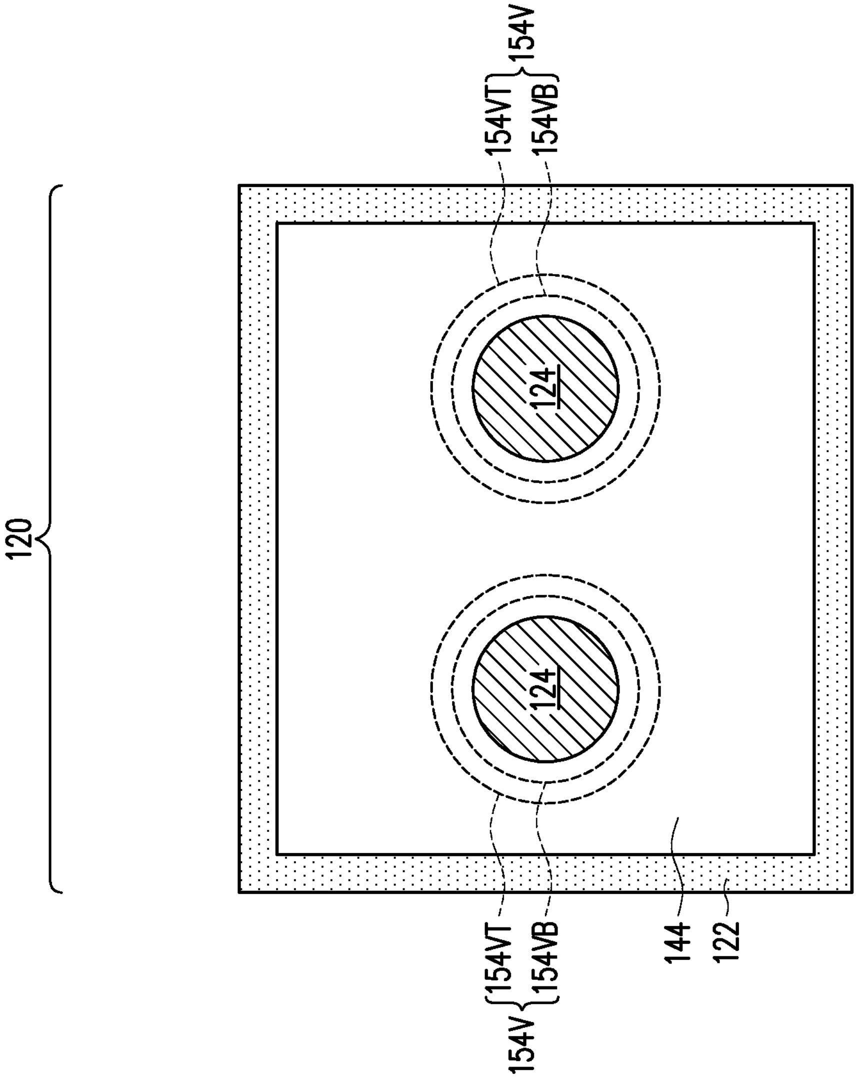

FIG. 10 is a detailed view of a region 10 of FIG. 9, where additional features are shown. The conductive vias 154V of the lower metallization layer 154 of the front-side redistribution structure 150 are illustrated. A first subset of the conductive vias 154V are physically and electrically coupled to the TSVs 124, while a second subset of the conductive vias 154V are physically and electrically coupled to the through vias 118.

As previously noted, the TSVs 124 are smaller than the through vias 118. For example, the critical dimension (e.g., width W2) of the through vias 118 may be larger than the critical dimension (e.g., width W3) of the TSVs 124. The TSVs 124 are also smaller than the conductive vias 154V. For example, the critical dimension (e.g., width W4) of the conductive vias 154V may be larger than the critical dimension (e.g., width W3) of the TSVs 124. Additionally, the through vias 118 may be larger than the conductive vias 154V. For example, the critical dimension (e.g., width W4) of the conductive vias 154V may be smaller than the critical dimension (e.g., width W2) of the through vias 118. In some embodiments, the width W2 of the through vias 118 is in the range of 40 μm to 120 μm, the width W3 of the TSVs 124 is in the range of 4.5 μm to 23 μm, and the width W4 of the conductive vias 154V is in the range of 12 μm to 45 μm. The critical dimension of the conductive vias 154V may be measured at the bottom of the conductive vias 154V. Forming the conductive vias 154V to be larger than the TSVs 124 may help reduce the off-landing risk of the conductive vias 154V (e.g., due to shifting during processing) even when the TSVs 124 are small. Process windows and/or design flexibility may thus be improved. The manufacturing yield of the integrated circuit packages 200 may be increased.

The isolation layer 144 is located at the back-side of the interconnection die 120. The isolation layer 144 of the interconnection die 120 is disposed between the conductive vias 154V and the substrate 122 of the interconnection die 120. Thus, the isolation layer 144 physically separates the substrate 122 from the overlying conductive vias 154V.

FIG. 11 is a top-down view of an interconnection die 120 of an interposer, where additional features are shown. The conductive vias 154V of the lower metallization layer 154 of the front-side redistribution structure 150 are illustrated. Specifically, the bottoms 154VB and the tops 154VT of the conductive vias 154V are shown in ghost. As more clearly shown the isolation layer 144 is formed around the TSVs 124 in the top-down view. Both the bottoms 154VB and the tops 154VT of the conductive vias 154V are larger than the TSVs 124. The isolation layer 144 extends beyond the bottoms 154VB and the tops 154VT of the conductive vias 154V. Because the isolation layer 144 is formed around the TSVs 124 in the top-down view, the bottoms 154VB of the conductive vias 154V land on and are in contact with the isolation layer 144 instead of with the substrates 122. The risk of electric leakage from the conductive vias 154V may thus be reduced. The performance of the integrated circuit packages 200 may be increased.

Figure 12:
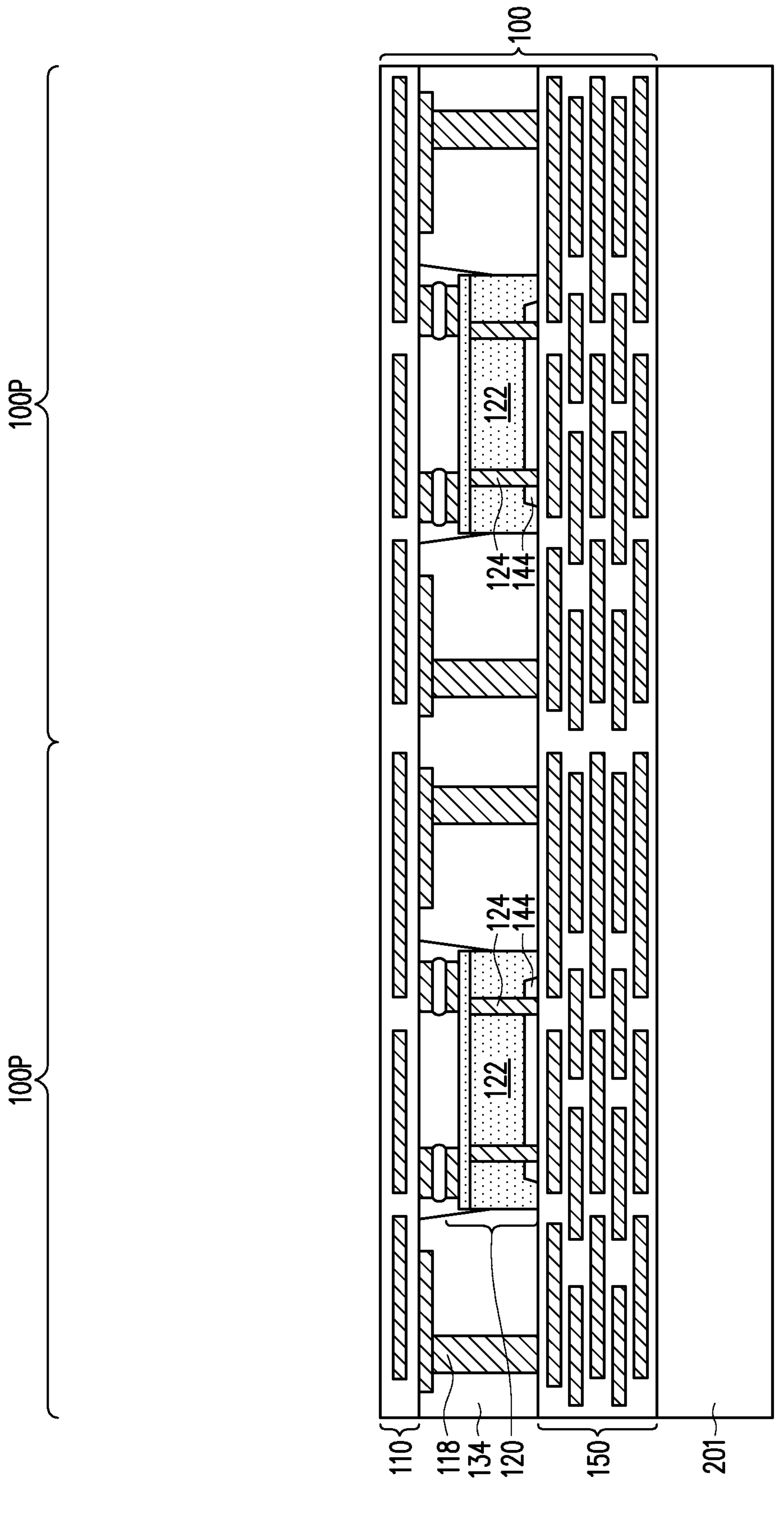

In FIG. 12, a carrier substrate de-bonding is performed to detach (or "de-bond") the carrier substrate 102 from the back-side of the interposer wafer 100. In accordance with some embodiments, the de-bonding includes projecting a light such as a laser light or an UV light on the release layer 104 so that the release layer 104 decomposes under the heat of the light and the carrier substrate 102 can be removed. The interposer wafer 100 is then flipped over to prepare for processing of the back-side of the interposer wafer 100. The front-side of the interposer wafer 100 may be placed on a carrier substrate 201 for subsequent processing. The carrier substrate 201 may be a glass carrier substrate, a ceramic carrier substrate, or the like. The carrier substrate 201 may be a wafer.

Figure 13:
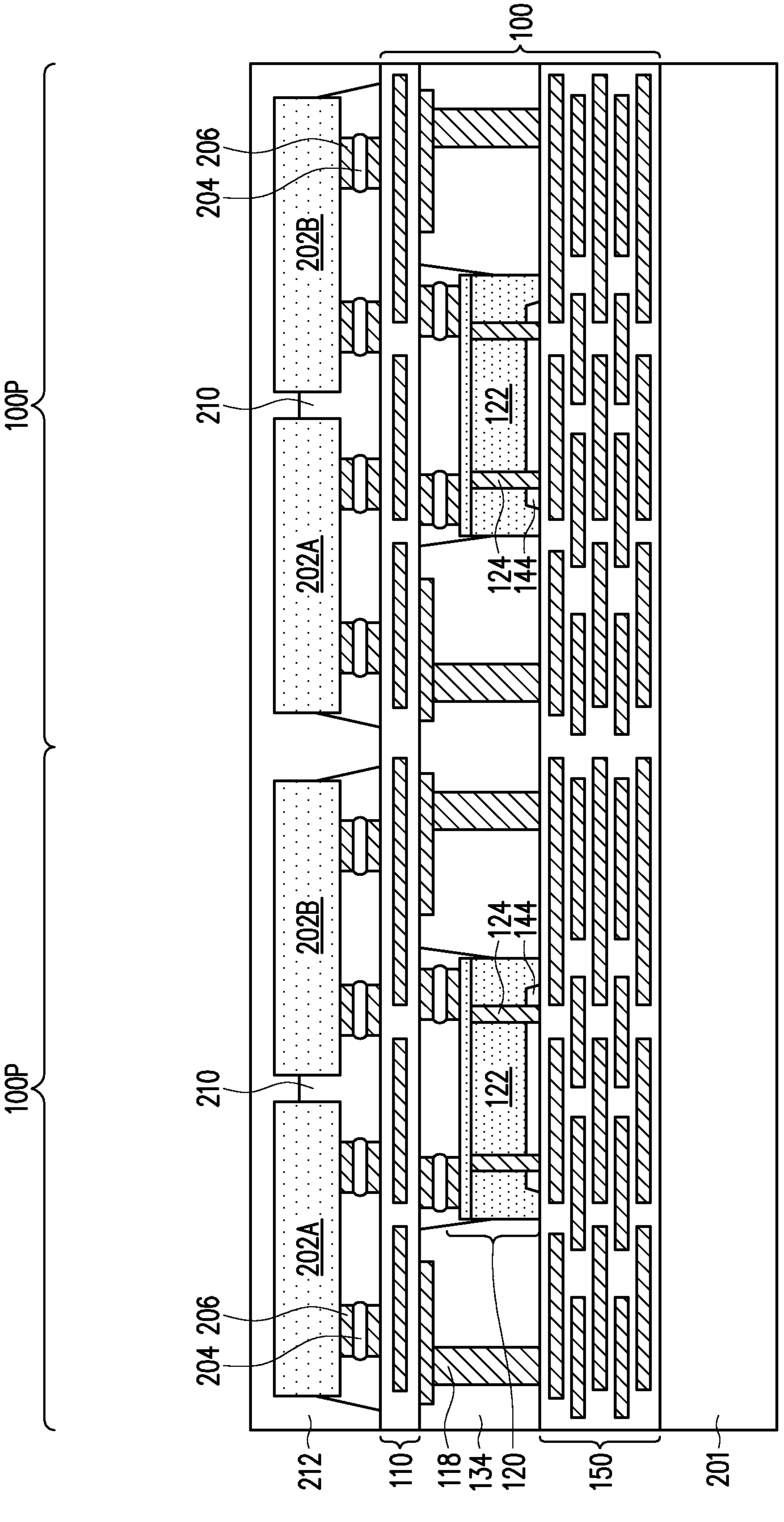

In FIG. 13, integrated circuit devices 202 are attached to the back-side of the interposer wafer 100 (e.g., to the back-side redistribution structure 110). Multiple integrated circuit devices 202 are placed adjacent one another in each package region 100P. The integrated circuit devices 202 in each package region 100P may include a logic device 202A and a memory device 202B. The logic devices 202A and the memory devices 202B may be formed in processes of a same technology node, or may be formed in processes of different technology nodes. For example, the logic devices 202A may be formed by a more advanced process node than the memory devices 202B.

Each logic device 202A may be a central processing unit (CPU), graphics processing unit (GPU), system-on-a-chip (SoC), microcontroller, or the like. The logic devices 202A may be integrated circuit dies (similar to the integrated circuit die 50 described for FIG. 1) or may be die stacks (similar to the die stack 60A described for FIG. 2A). In some embodiments, the logic devices 202A are integrated circuit dies such as system-on-a-chip (SoC) dies. In some embodiments, the logic devices 202A are die stacks such as system-on-integrated-chip (SoIC) devices.

Each memory device 202B may be a dynamic random access memory (DRAM) die, static random access memory (SRAM) die, hybrid memory cube (HMC) module, a high bandwidth memory (HBM) module, or the like. The memory devices 202B may be integrated circuit dies (similar to the integrated circuit die 50 described for FIG. 1) or may be die stacks (similar to the die stack 60B described for FIG. 2B). In some embodiments, the memory devices 202B are die stacks, such as high bandwidth memory (HBM) devices.

In the illustrated embodiment, the integrated circuit devices 202 are attached to the back-side redistribution structure 110 with solder bonds, such as with conductive connectors 204. The integrated circuit devices 202 may be placed on the back-side redistribution structure 110 using, e.g., a pick-and-place tool. The conductive connectors 204 may be formed of a conductive material that is reflowable, such as solder, copper, aluminum, gold, nickel, silver, palladium, tin, the like, or a combination thereof. In some embodiments, the conductive connectors 204 are formed by initially forming a layer of solder through methods such as evaporation, electroplating, printing, solder transfer, ball placement, or the like. Once a layer of solder has been formed on the structure, a reflow may be performed in order to shape the conductive connectors 204 into desired bump shapes. Attaching the integrated circuit devices 202 to the back-side redistribution structure 110 may include placing the integrated circuit devices 202 on the back-side redistribution structure 110 and reflowing the conductive connectors 204. Die connectors 206 are at the front-sides of the integrated circuit devices 202. The conductive connectors 204 form joints between the die connectors 206 of the integrated circuit devices 202 and die connectors (e.g., under-bump metallizations) of the back-side redistribution structure 110, thereby electrically connecting the interpose wafer 100 to the integrated circuit devices 202. In another embodiment, the integrated circuit devices 202 are attached to the back-side redistribution structure 110 with direct bonds, using the die connectors 206.

An underfill 210 may be formed around the conductive connectors 204, and between the back-side redistribution structure 110 and the integrated circuit devices 202. The underfill 210 may reduce stress and protect the joints resulting from the reflowing of the conductive connectors 204. The underfill 210 may be formed of an underfill material such as a molding compound, epoxy, or the like. The underfill 210 may be formed by a capillary flow process after the integrated circuit devices 202 are attached to the back-side redistribution structure 110, or may be formed by a suitable deposition method before the integrated circuit devices 202 are attached to the back-side redistribution structure 110. The underfill 210 may be applied in liquid or semi-liquid form and then subsequently cured.

An encapsulant 212 is formed on and around the various components. After formation, the encapsulant 212 encapsulates the underfill 210 (if present) and the integrated circuit devices 202. The encapsulant 212 may be a molding compound, epoxy, or the like. The encapsulant 212 may be applied by compression molding, transfer molding, or the like, and is formed over the back-side redistribution structure 110 such that the integrated circuit devices 202 are buried or covered. The encapsulant 212 is further formed in gap regions between the underfill 210 (if present) and/or the integrated circuit devices 202. The encapsulant 212 may be applied in liquid or semi-liquid form and then subsequently cured.

Optionally, the encapsulant 212 may be thinned (not separately illustrated) to expose the integrated circuit devices 202. The thinning process may be a grinding process, a chemical-mechanical polish (CMP), an etch-back, combinations thereof, or the like. After the thinning process, the top surfaces of the integrated circuit devices 202 and the encapsulant 212 are substantially coplanar (within process variations). The thinning is performed until a desired amount of the integrated circuit devices 202 and the encapsulant 212 has been removed.

Figure 14:
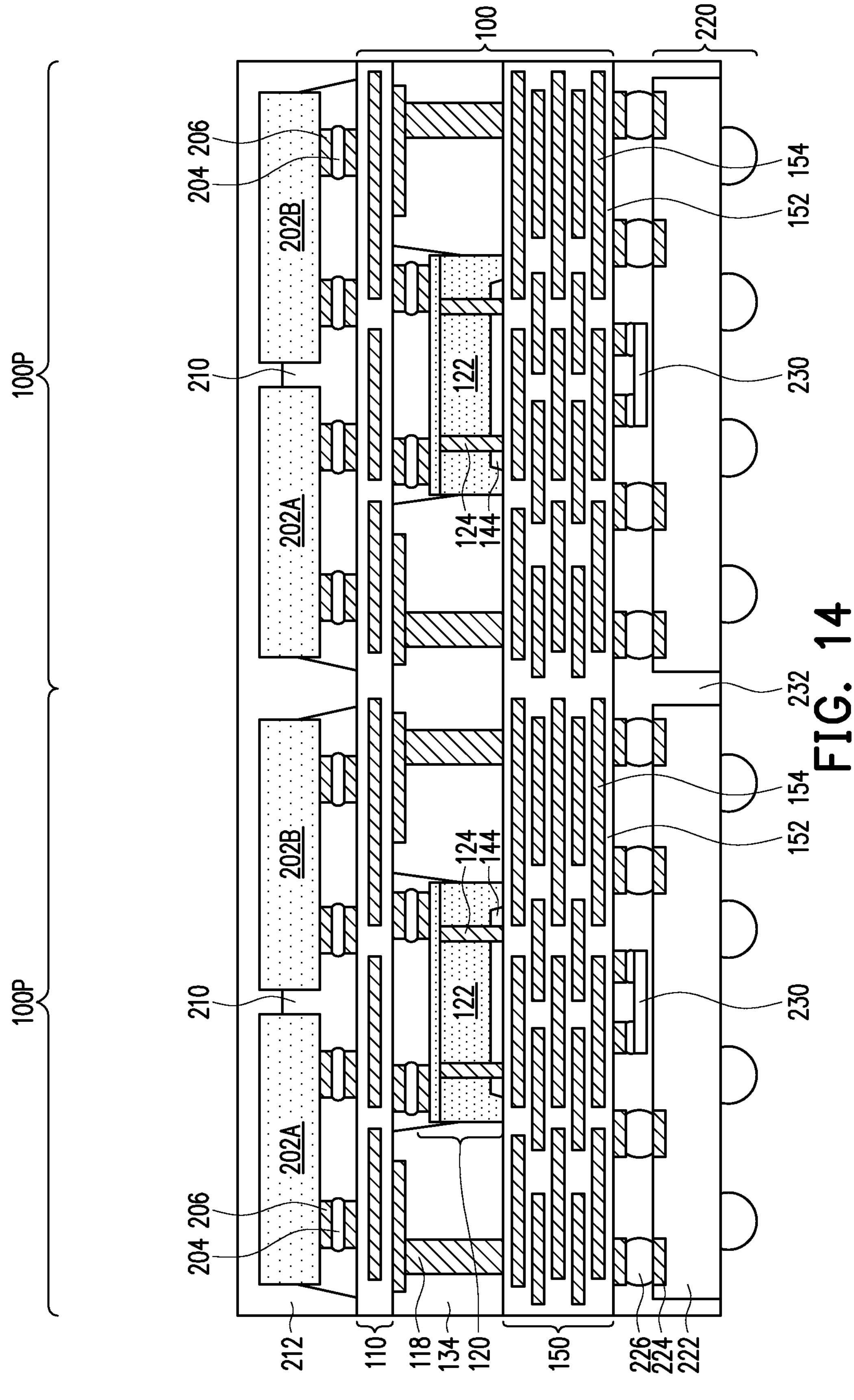

In FIG. 14, a carrier substrate de-bonding is performed to detach (or "de-bond") the carrier substrate 201 from the interposer wafer 100. Package substrates 220 are then bonded to the interposer wafer 100 (e.g., to the front-side redistribution structure 150). Each package substrate 220 is bonded to a corresponding interposer in a corresponding package region 100P. Each package substrate 220 includes a substrate core 222, which may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 222 may be a SOI substrate. Generally, an SOI substrate includes a layer of a semiconductor material such as epitaxial silicon, germanium, silicon germanium, SOI, SGOI, or combinations thereof. The substrate core 222 is, in one alternative embodiment, an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate core 222.

The substrate core 222 may include active and passive devices (not separately illustrated). Devices such as transistors, capacitors, resistors, combinations thereof, and the like may be used to generate the structural and functional requirements of the design for the system. The devices may be formed using any suitable methods. In some embodiments, the substrate core 222 is substantially free of active and passive devices.

The substrate core 222 may also include metallization layers and vias (not separately illustrated). Each package substrate 220 further includes bond pads 224 over the metallization layers and vias of the substrate core 222. The metallization layers may be formed over the active and passive devices and are designed to connect the various devices to form functional circuitry. The metallization layers may be formed of alternating layers of dielectric material (e.g., low-k dielectric material) and conductive material (e.g., copper), with vias interconnecting the layers of conductive material, and may be formed through any suitable process (such as deposition, damascene, or the like).

The package substrates 220 may be attached to the front-side redistribution structure 150 with solder bonds, such as with conductive connectors 226. The conductive connectors 226 may be formed of a conductive material that is reflowable, such as solder, copper, aluminum, gold, nickel, silver, palladium, tin, the like, or a combination thereof. In some embodiments, the conductive connectors 226 are formed by initially forming a layer of solder through methods such as evaporation, electroplating, printing, solder transfer, ball placement, or the like. Once a layer of solder has been formed on the structure, a reflow may be performed in order to shape the conductive connectors 226 into desired bump shapes.

Attaching the package substrates 220 to the front-side redistribution structure 150 may include placing the package substrates 220 on the front-side redistribution structure 150 and reflowing the conductive connectors 226. The conductive connectors 226 are reflowed to attach the bond pads 224 to die connectors (e.g., under-bump metallizations) of the front-side redistribution structure 150. The conductive connectors 226 connect the interposer wafer 100, including metallization layers of the front-side redistribution structure 150, to the package substrates 220, including metallization layers of the substrate cores 222. Thus, the package substrates 220 are electrically connected to the integrated circuit devices 202 in the corresponding package regions 100P.

Additionally, passive devices 230 may be attached to the interposer wafer 100 and/or the package substrates 220. In the illustrated embodiment, the passive devices 230 are attached to the interposer wafer 100, such as to the same surface of the front-side redistribution structure 150 as the conductive connectors 226. In another embodiment, the passive devices 230 are attached to the package substrate 220, such as to the same surface of the package substrate 220 as the conductive connectors 226. The passive devices 230 may include capacitors, resistors, inductors, the like, or a combination thereof. The passive devices 230 may be surface mount devices (SMDs), 2-terminal integrated passive devices (IPDs), multi-terminal IPDs, or the like.

In some embodiments, an encapsulant 232 is formed on and around the various components. After formation, the encapsulant 232 encapsulates the passive devices 230, the conductive connectors 226, and/or the package substrates 220. The encapsulant 232 may be a molding compound, epoxy, or the like. The encapsulant 232 may be applied by compression molding, transfer molding, or the like. The encapsulant 232 may be further formed in gap regions between the package substrates 220 and the front-side redistribution structure 150. The encapsulant 232 may be applied in liquid or semi-liquid form and then subsequently cured.

Figure 15:
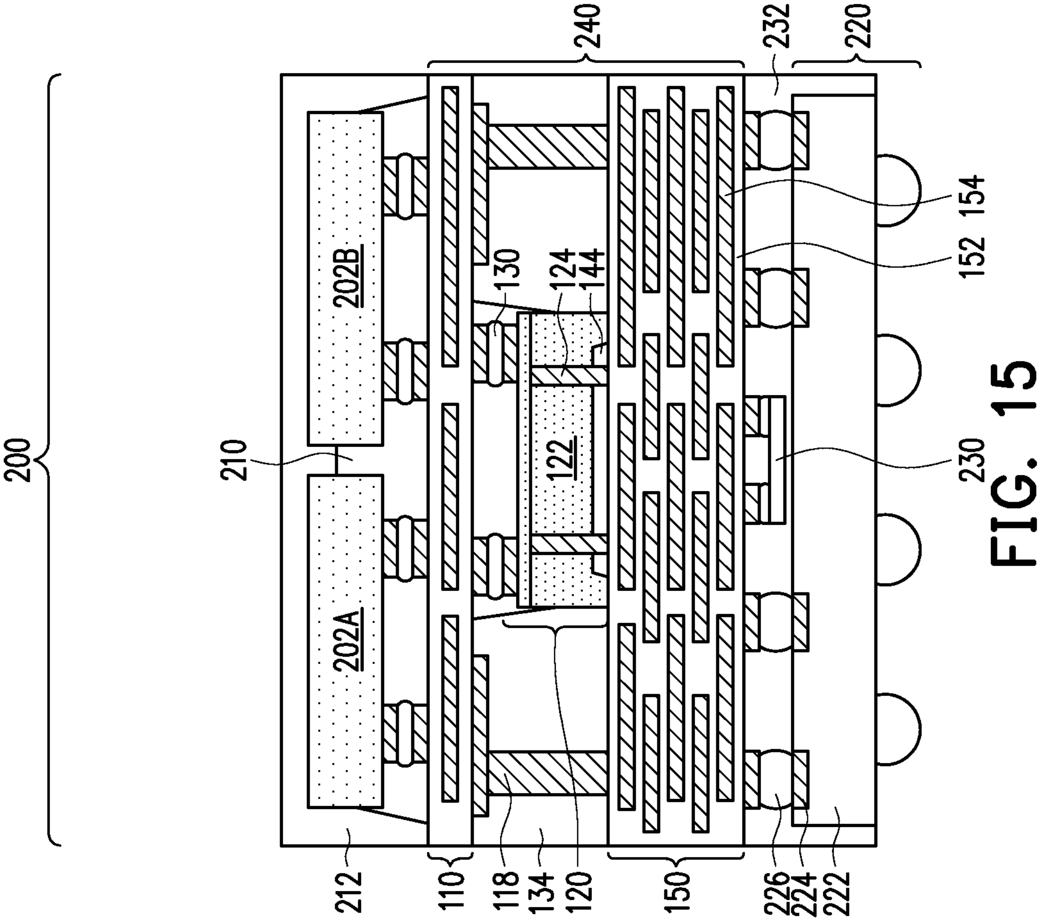

In FIG. 15, a singulation process is performed by cutting along scribe line region between the package regions 100P. The singulation process may include sawing, dicing, or the like. The singulation process singulates the package regions 100P from one another. The resulting, singulated integrated circuit package 200 is from a package region 100P. The singulation process forms interposers 240 from the singulated portions of the interposer wafer 100. As a result of the singulation process, the outer sidewalls of an interposer 240, the encapsulant 212, and the encapsulant 232 are laterally coterminous (within process variations).

Figure 16:
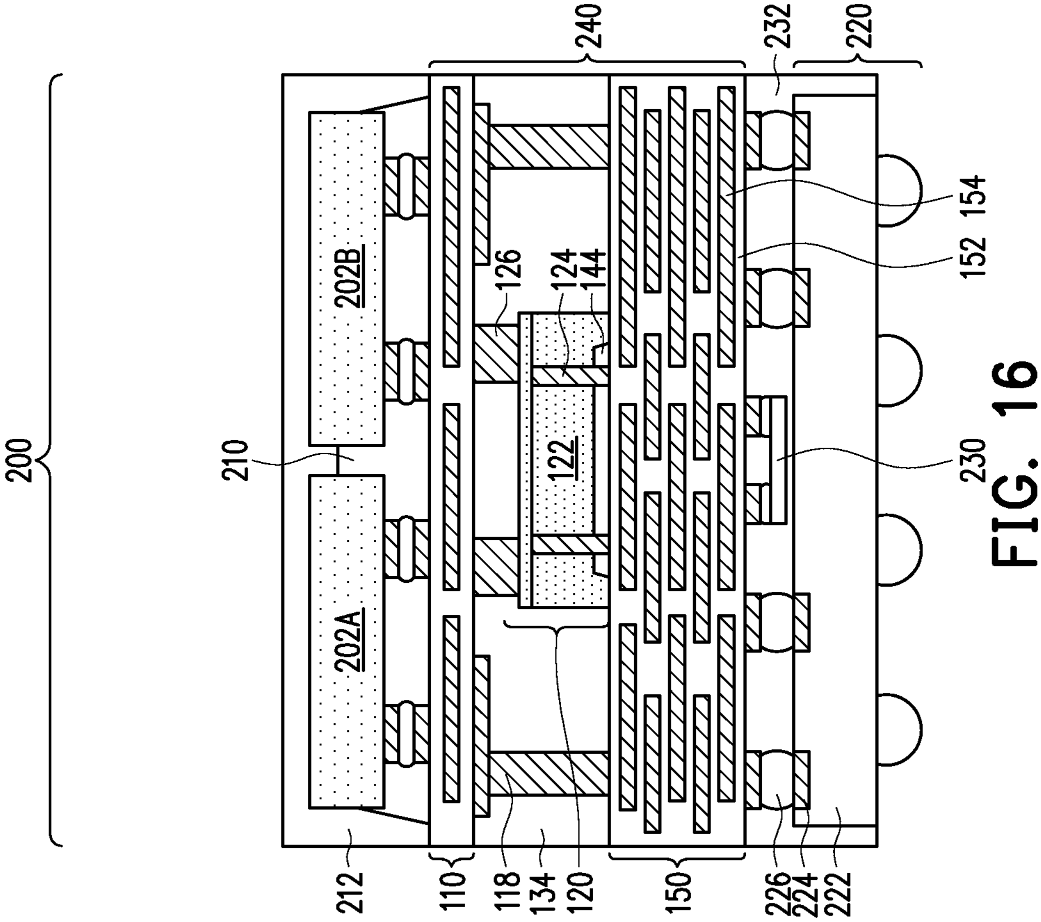
FIG. 16 is a view of an integrated circuit package, in accordance with some other embodiments.

FIG. 16 is a view of an integrated circuit package 200, in accordance with some other embodiments. This embodiment is similar to the embodiment of FIG. 15, except the interconnection die 120 is attached to the back-side redistribution structure 110 with direct bonds, using the die connectors 126. Further, in lieu of an underfill, the encapsulant 134 may be formed around the die connectors 126, and between the back-side redistribution structure 110 and the interconnection die 120.

FIGS. 17-23 are views of intermediate stages in the manufacturing of integrated circuit packages 200 (see FIG. 23), in accordance with some other embodiments. FIGS. 17, 18, 19, 20, 21, and 23 are cross-sectional views, while FIGS. 22A and 22B are top-down views. This embodiment is similar to the embodiment of FIGS. 3-15, except each interconnection die 120 will include multiple isolation layers 144, such that each isolation layer 144 encircles one TSV 124 protruding from a substrate 122. The isolation layers 144 may be donut-shaped in a top-down views. Forming a separate isolation layer 144 around each TSV 124 may help reduce the stress between the substrates 122 and the dielectric layers of the front-side redistribution structure 150.

Figure 17:
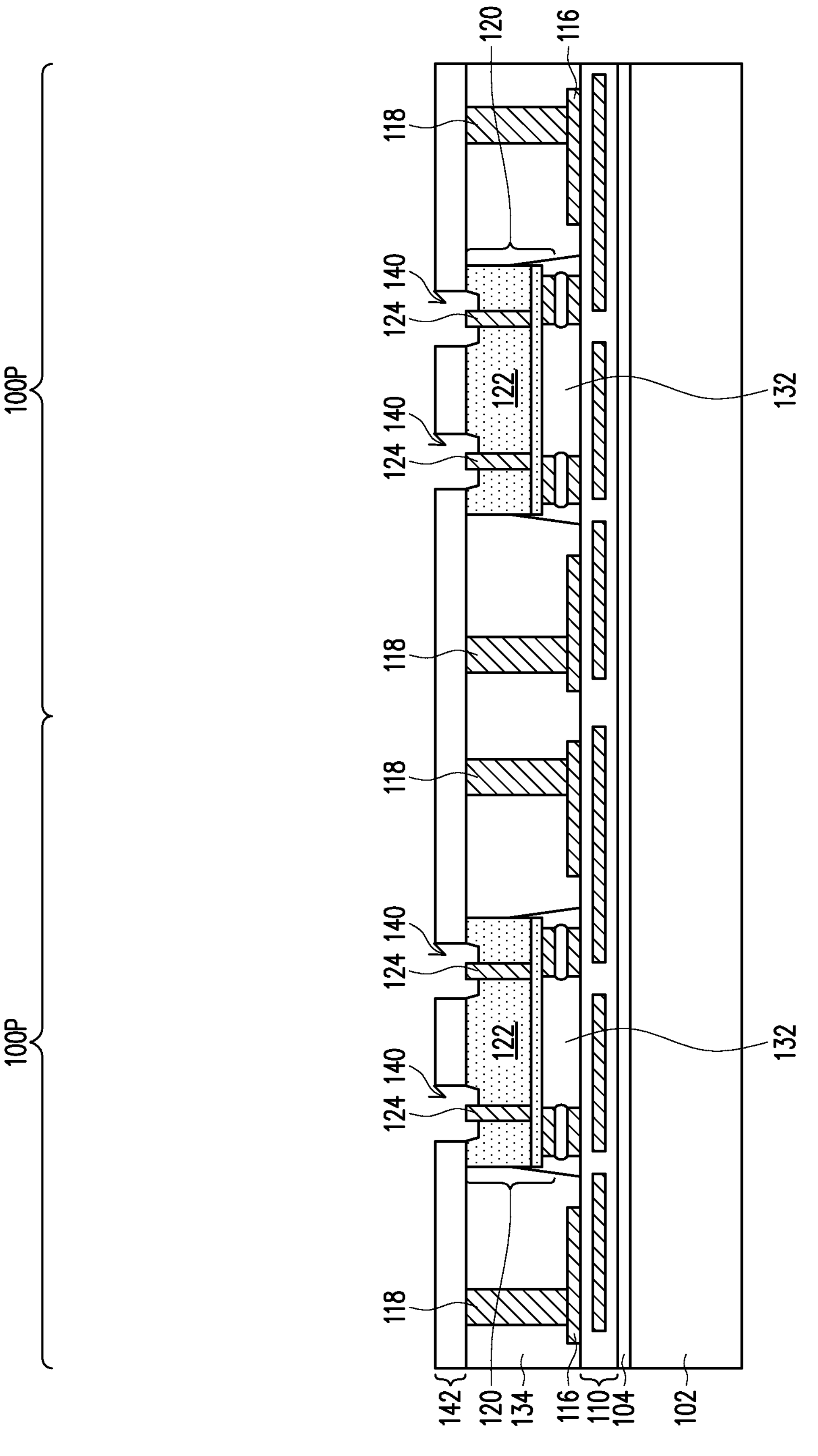
FIGS. 17-23 are views of intermediate stages in the manufacturing of integrated circuit packages, in accordance with some other embodiments.

In FIG. 17, and proceeding from the step of FIG. 5, recesses 140 are patterned in the substrates 122 of the interconnection dies 120. The recesses 140 may be patterned in a similar manner as previously described for FIG. 6 (e.g., using a mask 142 as an etching mask). In the illustrated embodiment, multiple recesses 140 are formed in each substrate 122. Each recess 140 encircles one TSV 124 protruding from a substrate 122.

Figure 18:
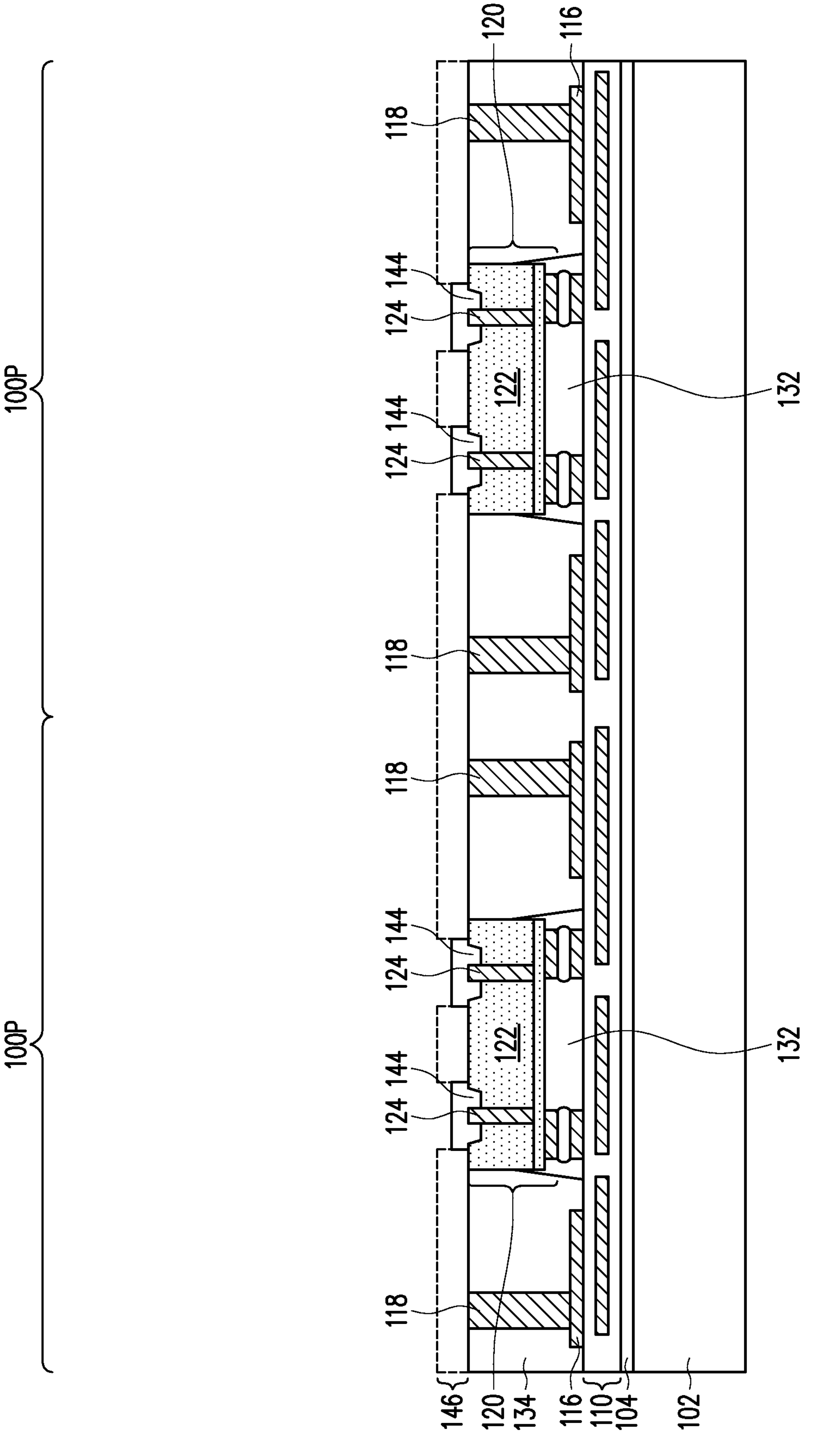

In FIG. 18, isolation layers 144 are formed in the recesses 140. The isolation layers 144 may be formed in a similar manner as previously described for FIG. 7 (e.g., using a mask 146).

Figure 19:
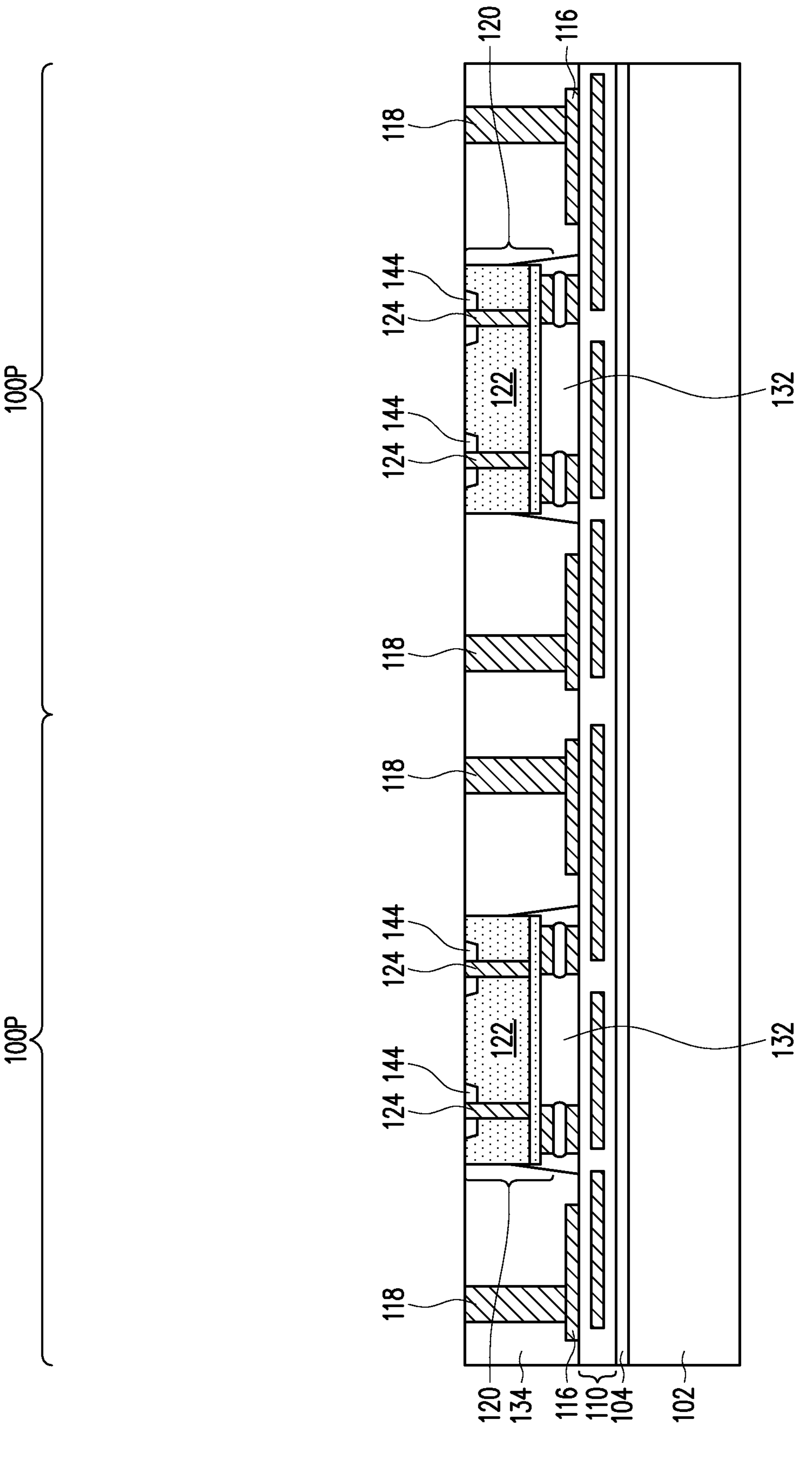

In FIG. 19, a removal process is applied to the isolation layers 144 to remove excess materials over the TSVs 124, thereby revealing the TSVs 124. The removal process may be performed in a similar manner as previously described for FIG. 8.

Figure 20:
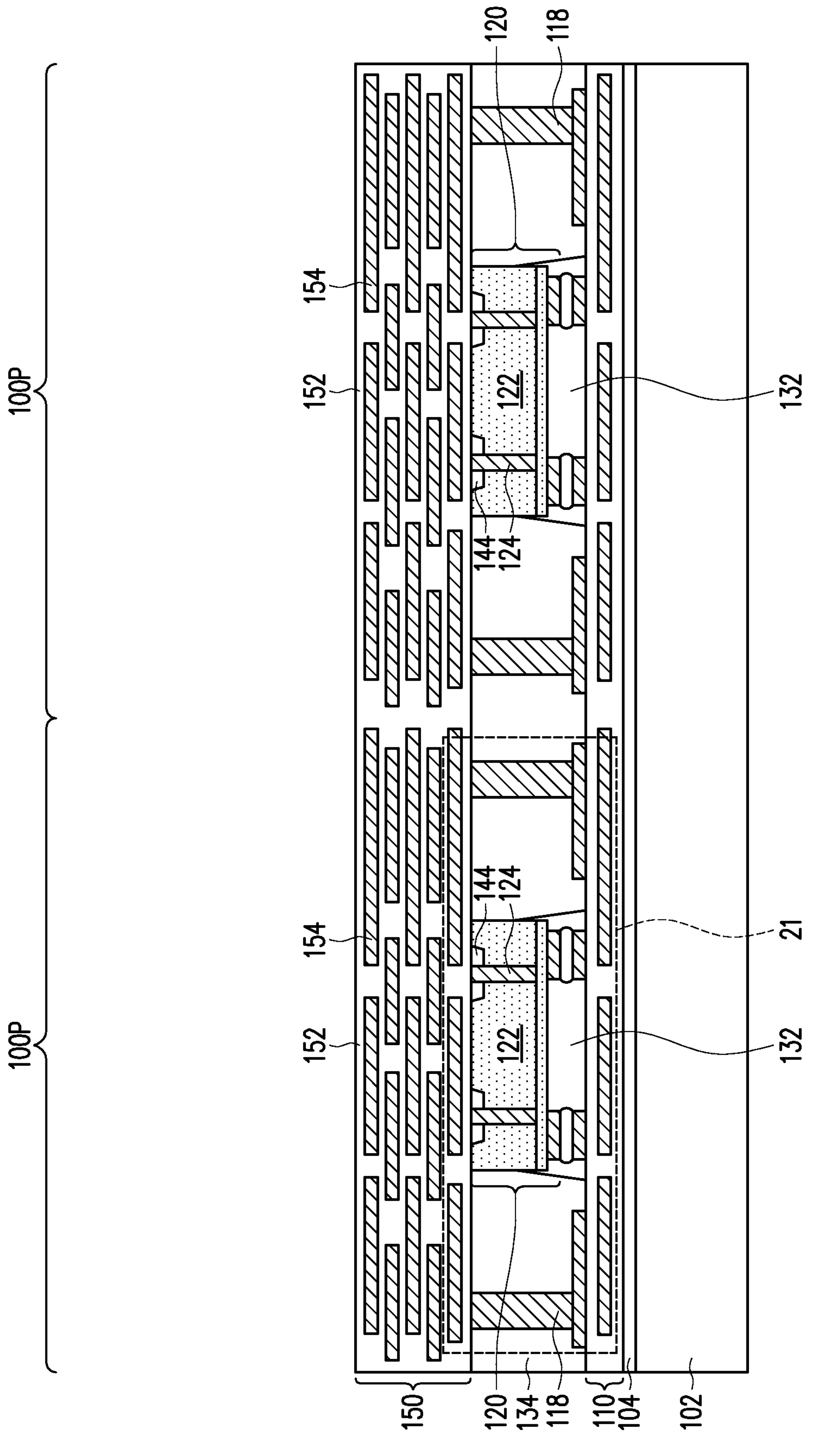

In FIG. 20, a front-side redistribution structure 150 is formed on the top surfaces of the through vias 118, the interconnection dies 120 (e.g., the substrates 122, the TSVs 124, and the isolation layers 144), and the encapsulant 134. The front-side redistribution structure 150 may be formed in a similar manner as previously described for FIG. 9.

Figure 21:
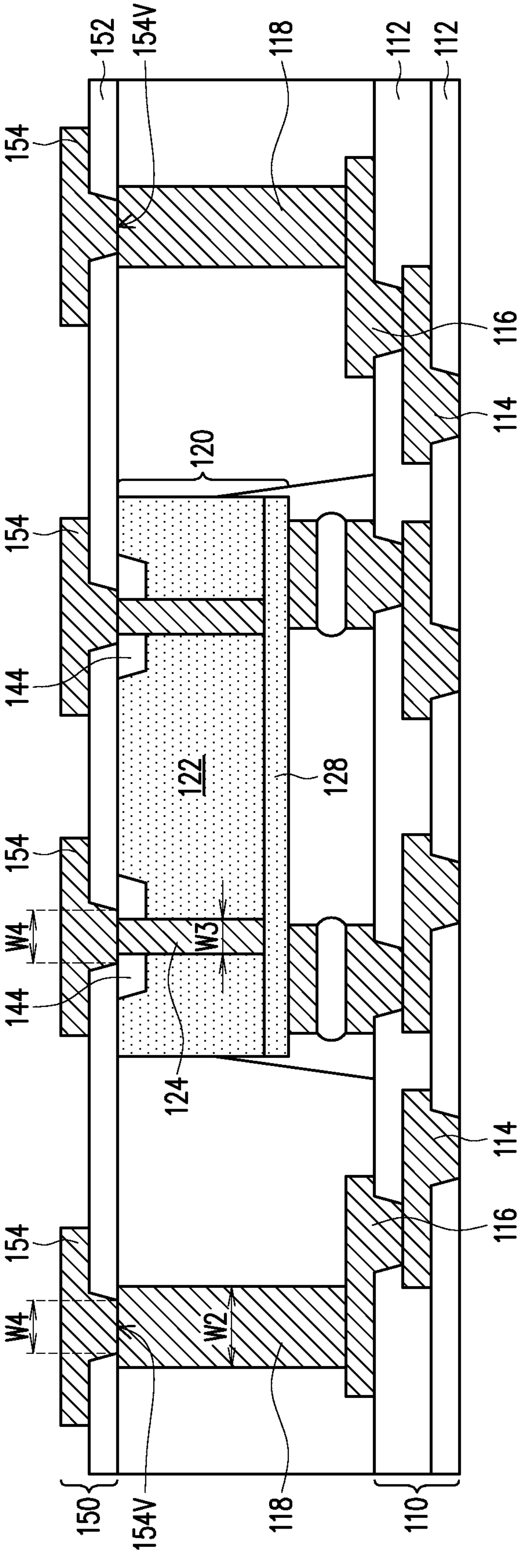

FIG. 21 is a detailed view of a region 21 of FIG. 20, where additional features are shown. The conductive vias 154V of the lower metallization layer 154 of the front-side redistribution structure 150 are illustrated. The through vias 118, the TSVs 124, and the conductive vias 154V may have the widths that were previously described for FIG. 10.

Figure 22A:
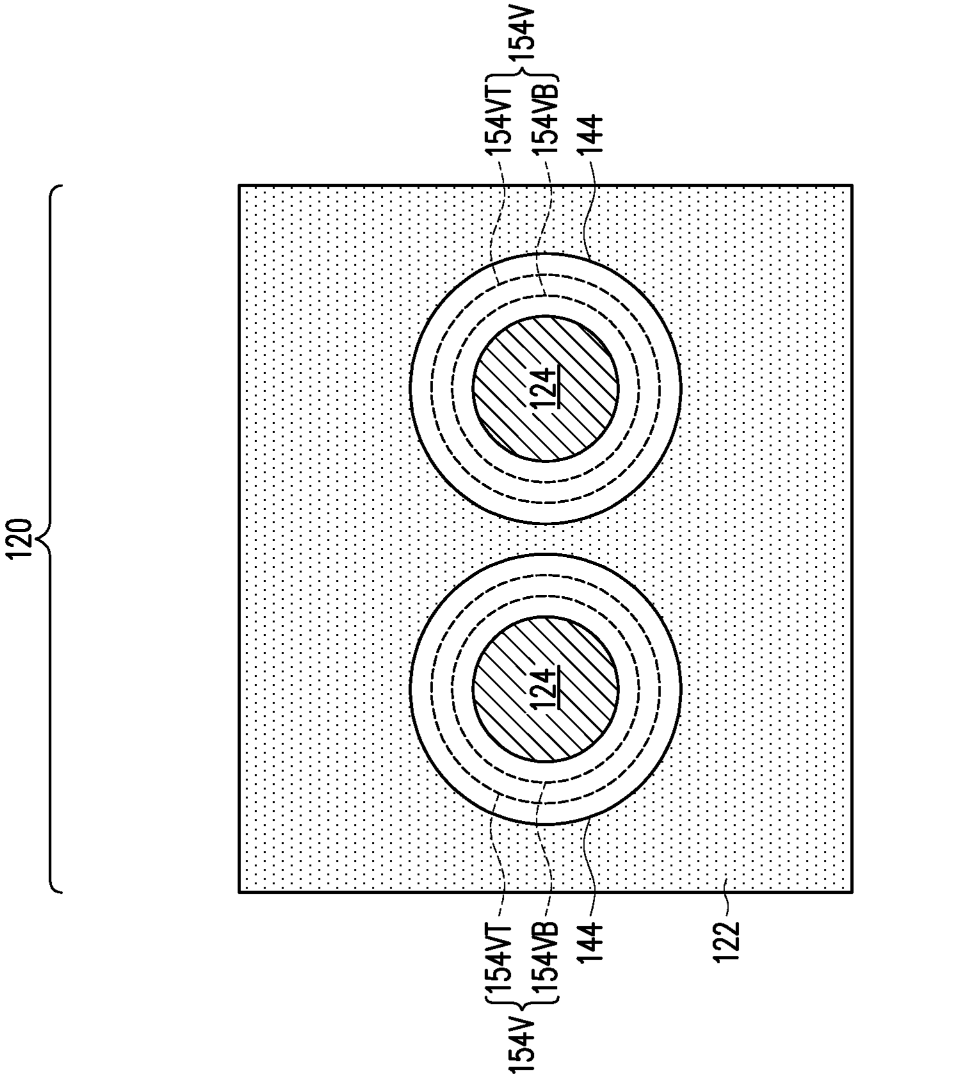
Figure 22B:
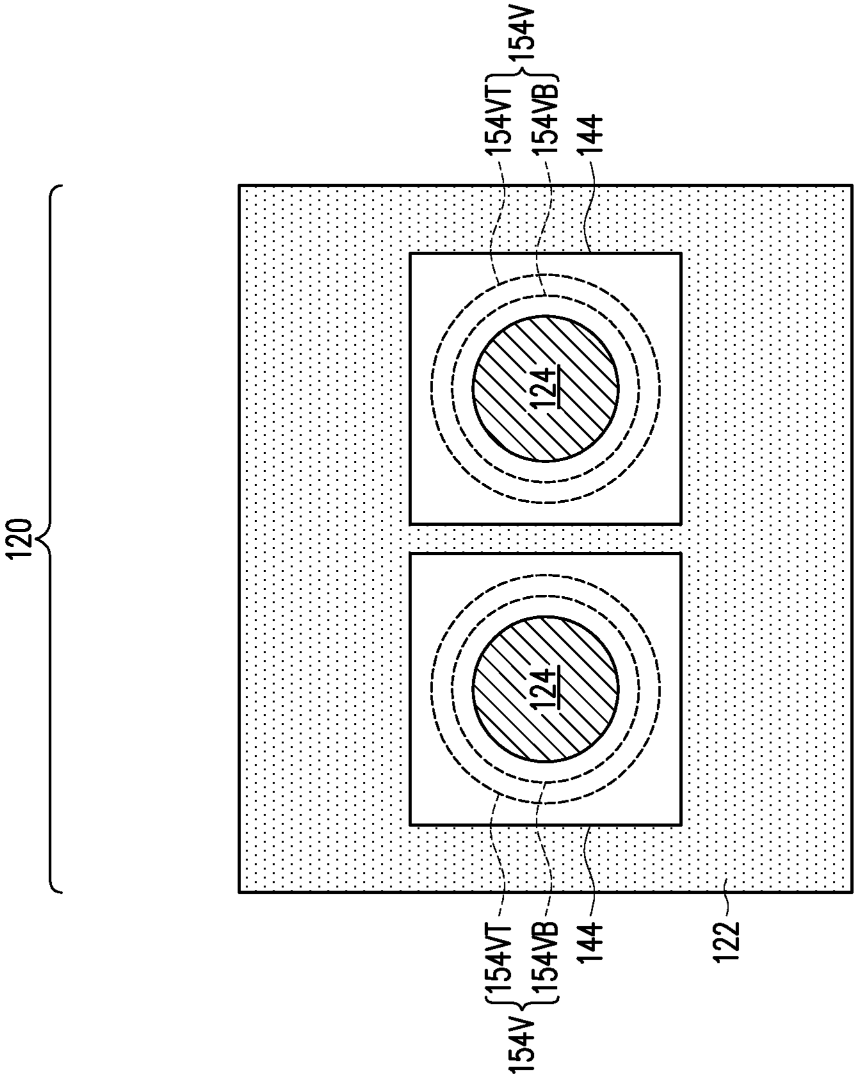

FIGS. 22A-22B are top-down views of an interconnection die 120 of an interposer, where additional features are shown. The conductive vias 154V of the lower metallization layer 154 of the front-side redistribution structure 150 are illustrated. Specifically, the bottoms 154VB and the tops 154VT of the conductive vias 154V are shown in ghost. Each respective isolation layer 144 extends beyond the bottom 154VB and the top 154VT of an overlying conductive via 154V. The isolation layers 144 may have any desired shape in a top-down view. For example, the isolation layers 144 may be circular isolation layers (as shown by FIG. 22A), rectangular isolation layers (as shown by FIG. 22B), or the like.

Figure 23:
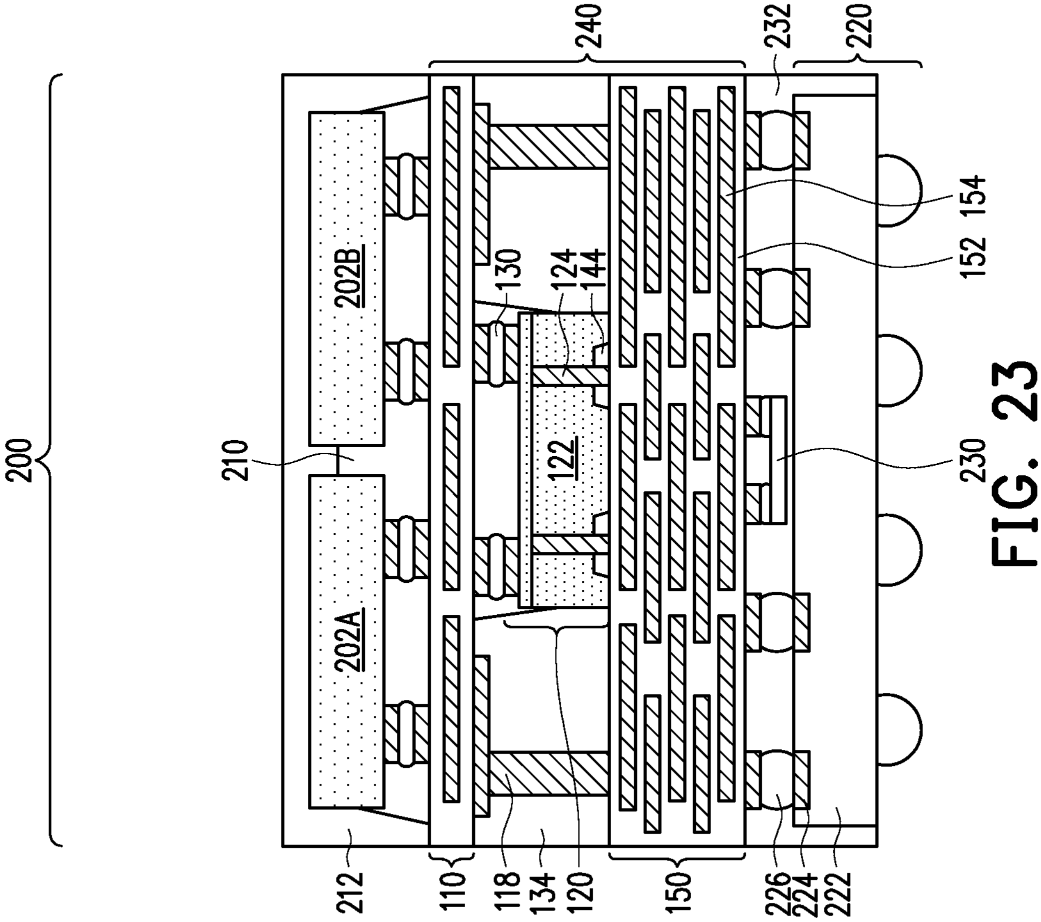

In FIG. 23, appropriate steps as previously described are performed to complete the manufacturing of an integrated circuit package 200.

Figure 24:
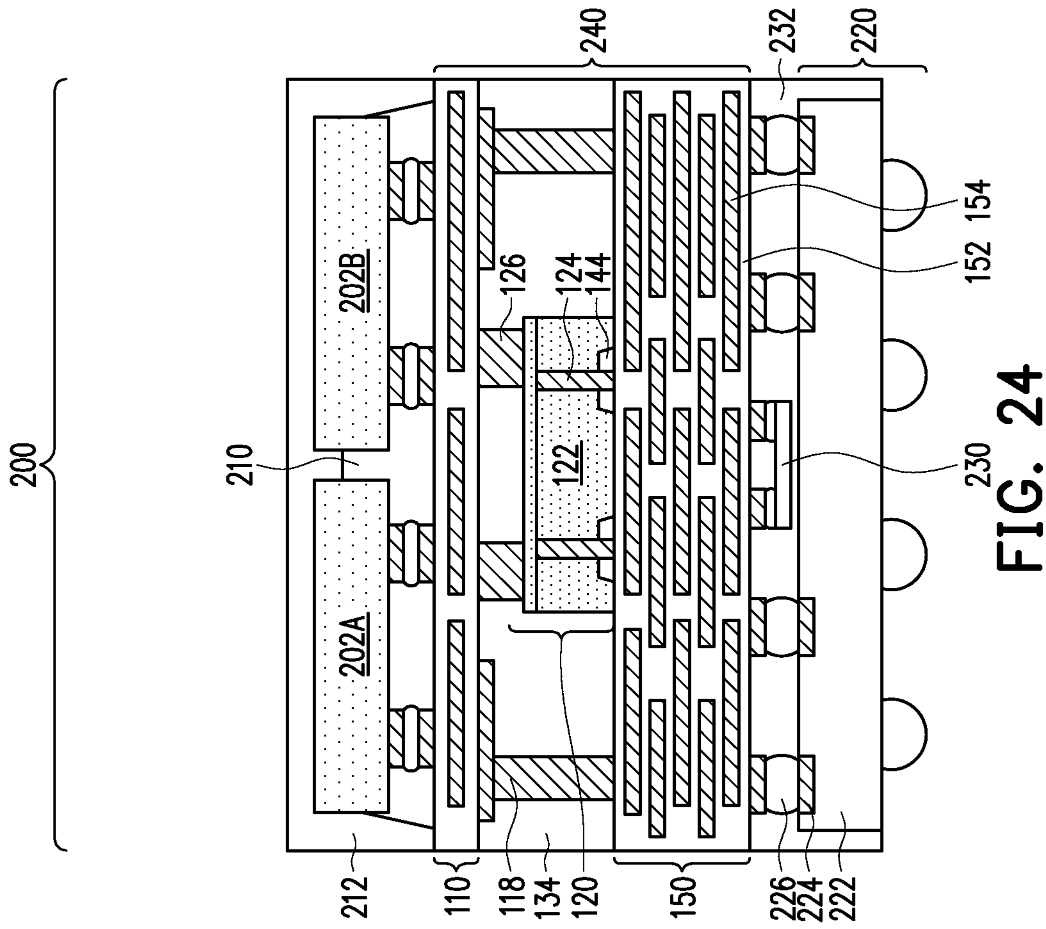
FIG. 24 is a view of an integrated circuit package, in accordance with some other embodiments.

FIG. 24 is a view of an integrated circuit package 200, in accordance with some other embodiments. This embodiment is similar to the embodiment of FIG. 23, except the interconnection die 120 is attached to the back-side redistribution structure 110 with direct bonds, using the die connectors 126. Further, in lieu of an underfill, the encapsulant 134 may be formed around the die connectors 126, and between the back-side redistribution structure 110 and the interconnection die 120.

Embodiments may achieve advantages. When the TSVs 124 are small, they may be formed to a higher density, thereby increasing the amount of connections to the interconnection dies 120. Forming the conductive vias 154V to be larger than the TSVs 124 may help reduce the off-landing risk of the conductive vias 154V (e.g., due to shifting during processing), which may increase manufacturing yield of the integrated circuit packages 200. Forming the isolation layers 144 around the TSVs 124 provides dielectric features on which the oversized conductive vias 154V may land, which may reduce the risk of electric leakage from the conductive vias 154V, which may increase performance of the integrated circuit packages 200.

In an embodiment, a device includes: an interposer including: a back-side redistribution structure; an interconnection die over the back-side redistribution structure, the interconnection die including a substrate, a through-substrate via protruding from the substrate, and an isolation layer around the through-substrate via; a first encapsulant around the interconnection die, a surface of the first encapsulant being substantially coplanar with a surface of the isolation layer and a surface of the through-substrate via; and a front-side redistribution structure over the first encapsulant, the front-side redistribution structure including a first conductive via that physically contacts the through-substrate via, the isolation layer separating the first conductive via from the substrate. In some embodiments, the device further includes: a through-mold via extending through the first encapsulant, a surface of the through-mold via being substantially coplanar with the surface of the first encapsulant, the surface of the isolation layer, and the surface of the through-substrate via. In some embodiments of the device, the front-side redistribution structure further includes a second conductive via that physically contacts the through-mold via. In some embodiments of the device, a width of the second conductive via is less than a width of the through-mold via. In some embodiments of the device, a width of the first conductive via is greater than a width of the through-substrate via. In some embodiments of the device, the through-substrate via protrudes from a back-side of the substrate, the isolation layer is located at the back-side of the substrate, and the interconnection die further includes a die bridge at a front-side of the substrate, the die bridge connected to the back-side redistribution structure. In some embodiments, the device further includes: an integrated circuit device attached to the interposer, the interconnection die overlapping the integrated circuit device; and a second encapsulant around the integrated circuit device. In some embodiments, the device further includes: a package substrate attached to the interposer; and a second encapsulant around the package substrate.

In an embodiment, a device includes: an interconnection die including a substrate, a first through-substrate via protruding from the substrate in a cross-sectional view, and a first isolation layer encircling the first through-substrate via in a top-down view; a through-mold via adjacent the interconnection die; an encapsulant around the through-mold via and the interconnection die; and a front-side redistribution structure over the encapsulant, the front-side redistribution structure including a first conductive via and a second conductive via, the first conductive via physically contacting the first through-substrate via and the first isolation layer, a width of the first conductive via being greater than a width of the through-substrate via in the cross-sectional view, the second conductive via physically contacting the through-mold via, a width of the second conductive via being less than a width of the through-mold via in the cross-sectional view. In some embodiments of the device, the interconnection die further includes: a second through-substrate via protruding from the substrate in the cross-sectional view, the first isolation layer encircling the second through-substrate via in the top-down view. In some embodiments of the device, the interconnection die further includes: a second through-substrate via protruding from the substrate in the cross-sectional view; and a second isolation layer encircling the second through-substrate via in the top-down view. In some embodiments of the device, the first isolation layer is circular in the top-down view. In some embodiments of the device, the first isolation layer is rectangular in the top-down view. In some embodiments of the device, the first isolation layer has inclined sidewalls in the cross-sectional view. In some embodiments of the device, the first isolation layer has straight sidewalls in the cross-sectional view.

In an embodiment, a method includes: encapsulating an interconnection die with an encapsulant, the interconnection die including a substrate and a through-substrate via; patterning a recess in the substrate, the recess encircling the through-substrate via; forming an isolation layer in the recess; planarizing the isolation layer, a top surface of the isolation layer being substantially coplanar with a top surface of the through-substrate via and a top surface of the encapsulant; and forming a front-side redistribution structure on the isolation layer and the encapsulant, the front-side redistribution structure including a first conductive via that physically contacts the through-substrate via and the isolation layer. In some embodiments of the method, patterning the recess in the substrate includes etching the substrate with a dry etch. In some embodiments of the method, forming the isolation layer includes: forming a mask on the encapsulant; and depositing a material of the isolation layer in an opening through the mask. In some embodiments of the method, the through-substrate via is one of a plurality of through-substrate vias of the interconnection die, and the recess encircles each of the through-substrate vias. In some embodiments of the method, the through-substrate via is one of a plurality of through-substrate vias of the interconnection die, the recess is one of a plurality of recesses patterned in the substrate, and respective ones of the recess encircle respective ones of the through-substrate vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

an interposer comprising:

a back-side redistribution structure;

an interconnection die over the back-side redistribution structure, the interconnection die comprising a substrate, a through-substrate via protruding from the substrate, and an isolation layer around the through-substrate via;

a first encapsulant around the interconnection die, a surface of the first encapsulant being substantially coplanar with a surface of the isolation layer and a surface of the through-substrate via; and a front-side redistribution structure over the first encapsulant, the front-side redistribution structure comprising a first conductive via that physically contacts the through-substrate via, the isolation layer separating the first conductive via from the substrate;

a package substrate attached to the front-side redistribution structure of the interposer; and a second encapsulant around the package substrate, the second encapsulant being separated from the first encapsulant by the front-side redistribution structure, outer sidewalls of the second encapsulant and the interposer being laterally coterminous.

2. The device of claim 1, further comprising:

a through-mold via extending through the first encapsulant, a surface of the through-mold via being substantially coplanar with the surface of the first encapsulant, the surface of the isolation layer, and the surface of the through-substrate via.

3. The device of claim 2, wherein the front-side redistribution structure further comprises a second conductive via that physically contacts the through-mold via.

4. The device of claim 3, wherein a width of the second conductive via is less than a width of the through-mold via.

5. The device of claim 1, wherein a width of the first conductive via is greater than a width of the through-substrate via.

6. The device of claim 1, wherein the through-substrate via protrudes from a back-side of the substrate, the isolation layer is located at the back-side of the substrate, and the interconnection die further comprises a die bridge at a front-side of the substrate, the die bridge connected to the back-side redistribution structure.

7. The device of claim 1, further comprising:

an integrated circuit device attached to the back-side redistribution structure of the interposer, the interconnection die overlapping the integrated circuit device; and a third encapsulant around the integrated circuit device.

8. A device comprising:

a back-side redistribution structure comprising under-bump metallization layers;

an interconnection die attached to a first subset of the under-bump metallization layers with solder bonds, the interconnection die comprising a substrate, a first through-substrate via protruding from the substrate in a cross-sectional view, and a first isolation layer encircling the first through-substrate via in a top-down view;

a through-mold via on a second subset of the under-bump metallization layers, the through-mold via disposed adjacent the interconnection die;

an encapsulant around the through-mold via, the interconnection die, and the under-bump metallization layers; and a front-side redistribution structure over the encapsulant, the front-side redistribution structure comprising a first conductive via and a second conductive via, the first conductive via physically contacting the first through-substrate via and the first isolation layer, a width of the first conductive via being greater than a width of the first through-substrate via in the cross-sectional view, the second conductive via physically contacting the through-mold via, a width of the second conductive via being less than a width of the through-mold via in the cross-sectional view.

9. The device of claim 8, wherein the interconnection die further comprises:

a second through-substrate via protruding from the substrate in the cross-sectional view, the first isolation layer encircling the second through-substrate via in the top-down view.

10. The device of claim 8, wherein the interconnection die further comprises:

a second through-substrate via protruding from the substrate in the cross-sectional view; and a second isolation layer encircling the second through-substrate via in the top-down view.

11. The device of claim 8, wherein the first isolation layer is circular in the top-down view.

12. The device of claim 8, wherein the first isolation layer is rectangular in the top-down view.

13. The device of claim 8, wherein the first isolation layer has inclined sidewalls in the cross-sectional view.

14. The device of claim 8, wherein the first isolation layer has straight sidewalls in the cross-sectional view.

15. A method comprising:

encapsulating an interconnection die with an encapsulant, the interconnection die comprising a substrate and a through-substrate via;

patterning a recess in the substrate, the recess encircling the through-substrate via, wherein patterning the recess comprises:

forming a first mask on the encapsulant; and etching the substrate using the first mask as an etching mask;

forming an isolation layer in the recess, wherein forming the isolation layer comprises:

forming a second mask on the encapsulant, the second mask being different from the first mask; and depositing a material of the isolation layer in an opening through the second mask;

planarizing the isolation layer, a top surface of the isolation layer being substantially coplanar with a top surface of the through-substrate via and a top surface of the encapsulant; and forming a front-side redistribution structure on the isolation layer and the encapsulant, the front-side redistribution structure comprising a first conductive via that physically contacts the through-substrate via and the isolation layer.

16. The method of claim 15, wherein patterning the recess in the substrate comprises etching the substrate with a dry etch.

17. The method of claim 15, wherein the through-substrate via is one of a plurality of through-substrate vias of the interconnection die, and the recess encircles each of the through-substrate vias.

18. The method of claim 15, wherein the through-substrate via is one of a plurality of through-substrate vias of the interconnection die, the recess is one of a plurality of recesses patterned in the substrate, and respective ones of the recesses encircle respective ones of the through-substrate vias.

19. The method of claim 15, further comprising:

removing the second mask after depositing the material of the isolation layer and before planarizing the isolation layer.

20. The method of claim 15, further comprising:

forming a back-side redistribution structure; and attaching the interconnection die to the back-side redistribution structure with solder bonds.

* * * * *